(12) United States Patent
Chien et al.

(10) Patent No.: US 9,154,792 B2
(45) Date of Patent: Oct. 6, 2015

(54) PROGRESSIVE CODING OF POSITION OF LAST SIGNIFICANT COEFFICIENT

(71) Applicant: Qualcomm Incorporated, San Diego, CA (US)

(72) Inventors: Wei-Jung Chien, San Diego, CA (US); Joel Sole Rojals, La Jolla, CA (US); Marta Karczewicz, San Diego, CA (US); Rajan Laxman Joshi, San Diego, CA (US)

(73) Assignee: QUALCOMM Incorporated, San Diego, CA (US)

( * ) Notice: Subject to any disclaimer, the term of this patent is extended or adjusted under 35 U.S.C. 154(b) by 564 days.

(21) Appl. No.: 13/669,032

(22) Filed: Nov. 5, 2012

(65) Prior Publication Data

US 2013/0114738 A1    May 9, 2013

Related U.S. Application Data

(60) Provisional application No. 61/557,317, filed on Nov. 8, 2011, provisional application No. 61/561,909, filed on Nov. 20, 2011.

(51) Int. Cl.
*H04N 7/26* (2006.01)
*H04N 19/88* (2014.01)
*H03M 7/40* (2006.01)
(Continued)

(52) U.S. Cl.
CPC ....... *H04N 19/00927* (2013.01); *H03M 7/4018* (2013.01); *H03M 7/4037* (2013.01); *H04N 19/13* (2014.11); *H04N 19/18* (2014.11);
(Continued)

(58) Field of Classification Search
CPC ............ H04N 19/00927; H04N 19/70; H04N 19/463; H04N 19/18; H04N 19/88; H04N 19/33; H03M 7/4018; H03M 7/4037
USPC ..................................................... 375/240.24
See application file for complete search history.

(56) References Cited

U.S. PATENT DOCUMENTS

| | | | |
|---|---|---|---|
| 7,088,271 B2 * | 8/2006 | Marpe et al. | ................... 341/107 |
| 7,564,384 B2 | 7/2009 | He et al. | |

(Continued)

FOREIGN PATENT DOCUMENTS

| | | |
|---|---|---|
| WO | 2011128268 A1 | 10/2011 |
| WO | 2011142817 A1 | 11/2011 |

OTHER PUBLICATIONS

International Preliminary Report on Patentability—PCT/US2012/063707—The International Bureau of WIPO Geneva, Switzerland, Feb. 19, 2014, 12 pp.

(Continued)

*Primary Examiner* — Jay Patel
*Assistant Examiner* — Francis G Geroleo
(74) *Attorney, Agent, or Firm* — Shumaker & Sieffert, P.A.

(57) ABSTRACT

A video encoder is configured to determine a first and second binary string for a value indicating the position of the last significant coefficient, within a video block of size T. A video decoder is configured to determine a value indicating the position of a last significant coefficient within a video block of size T based on a first and second binary string. In one example, the first binary string is based on a truncated unary coding scheme defined by a maximum bit length defined by 2 $\log_2(T)-1$ and the second binary string is based on a fixed length coding scheme defined by a maximum bit length defined by $\log_2(T)-2$.

56 Claims, 8 Drawing Sheets

(51) Int. Cl.
    *H04N 19/70* (2014.01)
    *H04N 19/13* (2014.01)
    *H04N 19/463* (2014.01)
    *H04N 19/18* (2014.01)

(52) U.S. Cl.
    CPC ............ *H04N19/463* (2014.11); *H04N 19/70* (2014.11); *H04N 19/88* (2014.11)

(56) References Cited

U.S. PATENT DOCUMENTS

| | | | |
|---|---|---|---|
| 7,702,013 | B2 | 4/2010 | Schwarz et al. |
| 2006/0017592 | A1 | 1/2006 | Shim et al. |
| 2007/0242894 | A1 | 10/2007 | Kautzer et al. |
| 2010/0040136 | A1 | 2/2010 | Sabo |
| 2012/0014454 | A1 | 1/2012 | Budagavi et al. |
| 2012/0099646 | A1 | 4/2012 | Coban et al. |
| 2012/0230402 | A1 | 9/2012 | Auyeung et al. |
| 2012/0262313 | A1 | 10/2012 | He et al. |
| 2013/0003858 | A1 | 1/2013 | Sze |
| 2013/0107969 | A1 | 5/2013 | Nguyen et al. |
| 2013/0114676 | A1 | 5/2013 | Guo et al. |
| 2014/0192861 | A1 | 7/2014 | Chuang et al. |
| 2014/0334539 | A1* | 11/2014 | Kim et al. ............. 375/240.03 |

OTHER PUBLICATIONS

ITU-T H.265, Series H: Audiovisual and Multimedia Systems, Infrastructure of audiovisual services—Coding of moving video, Advanced video coding for generic audiovisual services, The International Telecommunication Union. Apr. 2013, 317 pp.

Auyeung et al., "Context reduction of the last transform position in JCTVC-D262 for CE11.1", 5. JCT-VC meeting; 96. Mpeg meeting; Mar. 16, 2011-Mar. 23, 2011; Geneva; (Joint Collaborative Team on Video Coding of ISO/IEC JTC1/SC29/WG11 AND ITU-T SG.16 ); URL: HTTP://WFTP3.ITU.INT/AV-ARCH/JCTVC-SITE/ No. JCTVC-E344, Mar. 11, 2011, XP030008850, ISSN: 0000-0005 (6 pages).

Guo L., et al., "CABAC Contexts Reducing for Last position Coding-Revision 3 (JCTVC-HO537r3)", Feb. 3, 2012, pp. 1-5, XP055051244, Retrieved from the Internet: URL: HTTP://phemix.int-evry. fr/jct/index.php [retrieved on Jan. 28, 2013].

Hsiang S-T et al., "Non-CE11: Modified methods for coding the positions of last significant coefficient in the CABAC mode" 7. JCT-VC Meeting; 98. MPEG Meeting; Nov. 21, 2011-Nov. 30, 2011; Geneva; (Joint Collaborative Team on Video Coding of ISO/IEC JTC1/SC29/WG11 and ITU-T SG.16); URL: HTTP://WFTP3.ITU.INT/AV-ARCH/JCTVC-SITE/.. No. JCTVC-G239 Nov. 8, 2011, XP030110223 (4 pages).

International Search Report and Written Opinion—PCT/US2012/063707—ISA/EPO—Feb. 4, 2013, 17 pp.

Marpe D., et al., "Context-based adaptive binary arithmetic coding in the H.264/AVC video compression standard", IEEE Transactions on Circuits and Systems for Video Technology, Jul. 2003, vol. 13 (7), pp. 620-636.

Nguyen T., et al., "Modified binarization and coding of MVD for PIPE/CABACU", 6. JCT-VC Meeting; 97. MPEG Meeting; Jul. 14, 2011-Jul. 22, 2011; Torino; (Joint Collaborative Team on Video Coding of ISO/IEC JTC1/SC29N/WG11 and ITU-TSG. 16) ; URL: HTTP://WFTP3.ITU.INT/AV-ARCH/JCTVC-SITE/,, No. JCTVC-F455, Jul. 16, 2011, XP030009478 (2 pages).

Nguyen T, et al., "Reduced-Complexity entropy coding of transform coefficient levels using truncated golomb—rice codes in video compression," Image Processing (ICIP), 2011 18th IEEE International Conference on IEEE, Sep. 11, 2011, pp. 753-756, XP032080600, DOI: 10.1109/ICIP.2011.6116664 ISBN:978-1-4577-1304-0.

Sole, J. et al., "CE11: Parallel Context Processing for the significance map in high coding efficiency", 5. JCT-VC Meeting; 96. MPEG Meeting; Mar. 16, 2011-Mar. 23, 2011; Geneva; (Joint Collaborative Team on Video Coding of ISO/IEC JTC1/SC29/WG11 AND ITU-T SG.16); URL: HTTP://WFTP3.ITU.INT/AV-ARCH/JCTVC-SITE/ No. JCTVC-E338, Mar. 11, 2011, XP030008844, ISSN: 0000-0005 (4 pages).

Sole J., et al., "Parallel Context Processing for the significance map in high coding efficiency" , 4. JCT-VC Meeting; 95. MPEG Meeting; Jan. 20, 2011-Jan. 28, 2011; Daegu; (Joint Collaborative Team on Video Coding of ISO/IEC JTC1/SC29/WG11 and ITU-T SG. 16); URL: HTTP://WFTP3.ITU.INT/AV-ARCH/JCTVC-SITE/, No. JCTVC-D262, Jan. 16, 2011, XP030008302, ISSN: 0000-0013 (4 pages).

Second Written Opinion of international application No. PCT/US2012/06307, dated Oct. 25, 2013, 9 pp.

Reply to First Written Opinion of international application No. PCT/US2012/06307, dated May 3, 2013, 23 pp.

Bossen, "Common test conditions and software reference configurations," JCTVC-F900, Joint Collaborative Team on Video Coding (JCT-VC) of ITU-T SG16 WP3 and ISO/IEC JTC1/SC29/WG11, 6th Meeting: Torino, IT, Jul. 14-22, 2011, pp. 1-3.

Bross et al., "High efficiency video coding (HEVC) text specification draft 6," 7th Meeting: Geneva, CH, Nov. 21-30, 2011, JCTVC-H1003, 259 pp.

Bross et al., "High efficiency video coding (HEVC) text specification draft 7," 9th Meeting: Geneva, CH, Apr. 27-May 7, 2012, JCTVC-I1003_d21, 290 pp.

Bross et al., "High efficiency video coding (HEVC) text specification draft 8," 10th Meeting: Stockholm, SE, Jul. 11-20, 2012, JCTVC-J1003_d7, 261 pp.

Bross et al., "WD4: Working Draft 4 of High-Efficiency Video Coding," 6th Meeting: JCTVC-F803_d2, Torino, IT, Jul. 14-22, 2011, 226 pp.

Bross et al., "WD5: Working Draft 5 of High-Efficiency Video Coding," 7th Meeting: Geneva, Switzerland, Nov. 2011, JCTVC-G1103_d2, 214 pp.

Budagavi et al., "Parallel context processing techniques for high coding efficiency entropy coding in HEVC," JCTVC Meeting, Jul. 21, 2010-Jul. 28, 2010; Geneva, CH, JCTVC-B088, Jul. 24, 2010, 11 pp.

Chien, et al., "Last position coding for CABAC," JCTVC-G704, 7th Meeting: Geneva, Nov. 21-30, 2011, 4 pages.

ITU-T H.264, Series H: Audiovisual and Multimedia Systems, Infrastructure of audiovisual services—Coding of moving video, Advanced video coding for generic audiovisual services, The International Telecommunication Union. Jun. 2011, 674 pp.

Seregin, et al., "Binarisation modification for last position coding," JCTVC-F375, 6th Meeting, Torino, IT, Jul. 14-22, 2011, pp. 1-10.

Wiegand et al., "WD1: Working Draft 1 of High-Efficiency Video Coding", JCTVC-C403, 3rd Meeting: Guangzhou, CN, Oct. 7-15, 2010, 137 pp.

Wiegand et al., "WD2: Working Draft 2 of High-Efficiency Video Coding," JCTVC-D503, Jan. 20-28, 2011, 153 pp.

Wiegand et al., "WD3: Working Draft 3 of High-Efficiency Video Coding," Document JCTVC-E603, 5th Meeting: Geneva, CH, Mar. 16-23, 2011,193 pp.

U.S. Appl. No. 13/669,096, by Liwei Guo, filed Nov. 5, 2012.

First Examination Report from counterpart Australian Patent Application No. 2012336017, dated Apr. 17, 2015, 3 pp.

ITU-T H.265, Series H: Audiovisual and Multimedia Systems, Infrastructure of audiovisual services—Coding of moving video, Advanced video coding for generic audiovisual services, The International Telecommunication Union, Oct. 2014, 540 pp.

Office Action from U.S. Appl. No. 13/669,096, dated May 12, 2015, 17 pp.

* cited by examiner

PROGRESSIVE CODING OF POSITION OF LAST SIGNIFICANT COEFFICIENT

This application claims the benefit of:
U.S. Provisional Application No. 61/557,317, filed Nov. 8, 2011; and
U.S. Provisional Application No. 61/561,909, filed Nov. 20, 2011, each of which is hereby incorporated by reference in its respective entirety.

TECHNICAL FIELD

This disclosure relates to video coding.

BACKGROUND

Digital video capabilities can be incorporated into a wide range of devices, including digital televisions, digital direct broadcast systems, wireless broadcast systems, personal digital assistants (PDAs), laptop or desktop computers, tablet computers, e-book readers, digital cameras, digital recording devices, digital media players, video gaming devices, video game consoles, cellular or satellite radio telephones, so-called "smart phones," video teleconferencing devices, video streaming devices, and the like. Digital video devices implement video compression techniques, such as those described in the standards defined by MPEG-2, MPEG-4, ITU-T H.263, ITU-T H.264/MPEG-4, Part 10, Advanced Video Coding (AVC), the High Efficiency Video Coding (HEVC) standard presently under development, and extensions of such standards. Video devices may transmit, receive, encode, decode, and/or store digital video information more efficiently by implementing such video compression techniques.

Video compression techniques perform spatial (intra-picture) prediction and/or temporal (inter-picture) prediction to reduce or remove redundancy inherent in video sequences. For block-based video coding, a video slice (i.e., a video frame or a portion of a video frame) may be partitioned into video blocks, which may also be referred to as treeblocks, coding units (CUs) and/or coding nodes. Video blocks in an intra-coded (I) slice of a picture are encoded using spatial prediction with respect to reference samples in neighboring blocks in the same picture. Video blocks in an inter-coded (P or B) slice of a picture may use spatial prediction with respect to reference samples in neighboring blocks in the same picture or temporal prediction with respect to reference samples in other reference pictures. Pictures may be referred to as frames, and reference pictures may be referred to a reference frames.

Spatial or temporal prediction results in a predictive block for a block to be coded. Residual data represents pixel differences between the original block to be coded and the predictive block. An inter-coded block is encoded according to a motion vector that points to a block of reference samples forming the predictive block, and the residual data indicating the difference between the coded block and the predictive block. An intra-coded block is encoded according to an intra-coding mode and the residual data. For further compression, the residual data may be transformed from the pixel domain to a transform domain, resulting in residual transform coefficients, which then may be quantized. The quantized transform coefficients, initially arranged in a two-dimensional array, may be scanned in order to produce a one-dimensional vector of transform coefficients, and entropy coding may be applied to achieve even more compression.

SUMMARY

Figure 1:
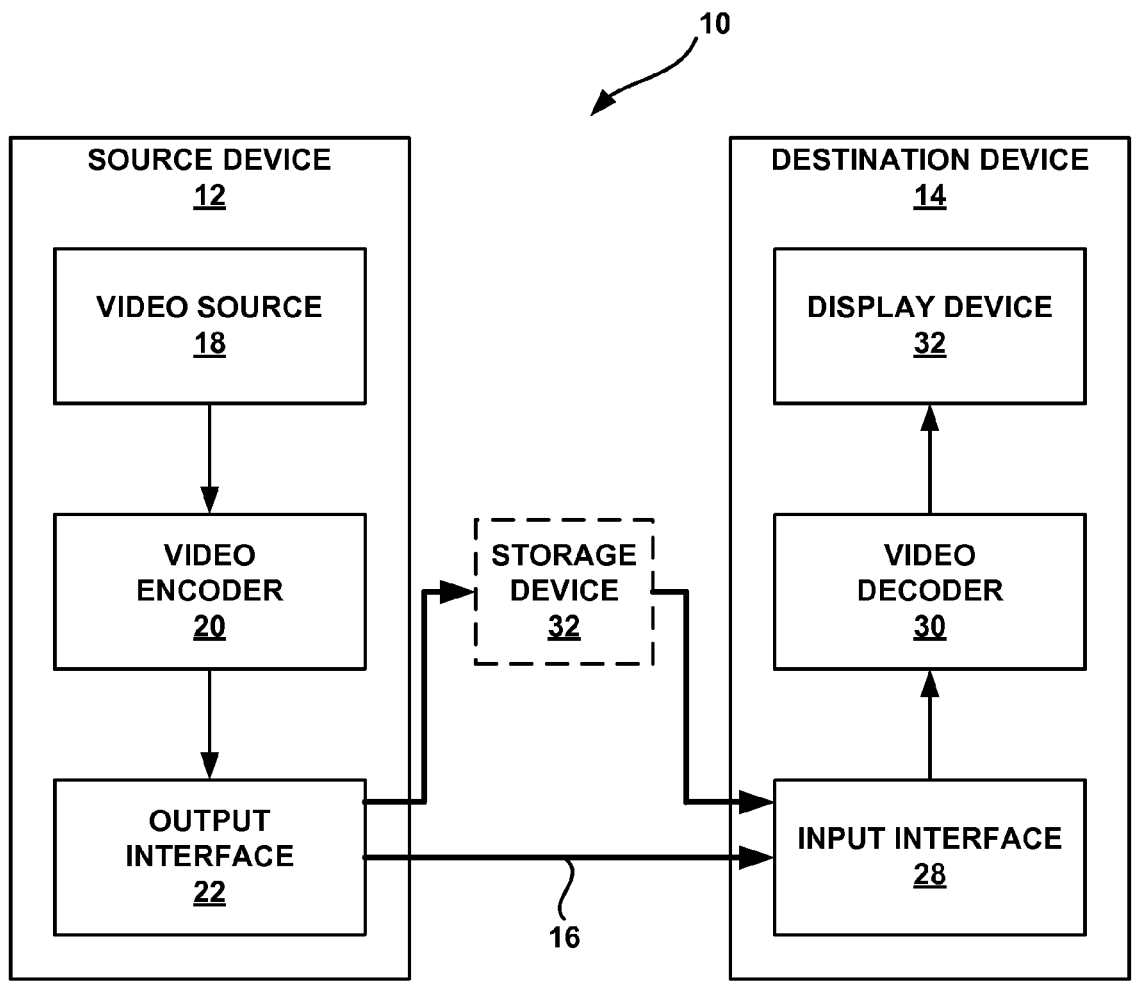
FIG. 1 is a block diagram illustrating an example video encoding and decoding system that may utilize the techniques described in this disclosure.

In general, this disclosure describes techniques for coding video data. Video encoding generally involves predicting a block of video data using a particular prediction mode, and coding residual values for the block based on differences between the predicted block and the actual block being coded. A residual block includes such pixel-by-pixel differences. The residual block may be transformed and quantized. A video coder may include a quantization unit that maps transform coefficients into discrete level values. This disclosure provides techniques for coding the position of a last significant coefficient within a video block.

In one example, a method for encoding video data comprises obtaining a value indicating a position of a last significant coefficient within a video block of size T, determining a first binary string for the value indicating the position of the last significant coefficient based on a truncated unary coding scheme defined by a maximum bit length defined by $2 \log_2(T)-1$, determining a second binary string for the value indicating the position of the last significant coefficient based on a fixed length coding scheme and encoding the first and second binary strings to a bitstream.

In another example, a method for decoding video data comprises obtaining a first binary string and a second binary string from an encoded bitstream, determining a value indicating the position of a last significant coefficient within a video block of size T based in part on the first binary string, wherein the first binary string is defined by a truncated unary coding scheme with a maximum bit length defined by $2 \log_2(T)-1$ and determining the value indicating the position of the last significant coefficient based in part on the second binary string, wherein the second binary string is defined by a fixed length coding scheme.

In another example, an apparatus for encoding video data comprises a video encoding device configured to obtain a value indicating a position of a last significant coefficient within a video block of size T, determine a first binary string for the value indicating the position of the last significant coefficient based on a truncated unary coding scheme defined by a maximum bit length defined by $2 \log_2(T)-1$, determine a second binary string for the value indicating the position of the last significant coefficient based on a fixed length coding scheme and encode the first and second binary strings to a bitstream.

In another example, an apparatus for decoding video data comprises a video decoding device configured to obtain a first binary string and a second binary string from an encoded bitstream, determine a value indicating the position of a last significant coefficient within a video block of size T based in part on the first binary string, wherein the first binary string is defined by a truncated unary coding scheme with a maximum bit length defined by $2 \log_2(T)-1$ and determine the value indicating the position of the last significant coefficient based in part on the second binary string, wherein the second binary string is defined by a fixed length coding scheme.

In another example, a device for encoding video data comprises means for obtaining a value indicating a position of a last significant coefficient within a video block of size T, means for determining a first binary string for the value indicating the position of the last significant coefficient based on a truncated unary coding scheme defined by a maximum bit length defined by $2 \log_2(T)-1$, means for determining a second binary string for the value indicating the position of the last significant coefficient based on a fixed length coding scheme and means for encoding the first and second binary strings to a bitstream.

In another example, a device for decoding video data comprises means for obtaining a first binary string and a second binary string from an encoded bitstream, means for determining a value indicating the position of a last significant coefficient within a video block of size T based in part on the first binary string, wherein the first binary string is defined by a truncated unary coding scheme with a maximum bit length defined by $2 \log_2(T)-1$ and means for determining the value indicating the position of the last significant coefficient based in part on the second binary string, wherein the second binary string is defined by a fixed length coding scheme.

In another example, a computer-readable storage medium comprises instructions stored thereon that, when executed, cause a processor of a device for encoding video data to cause one or more processors to obtain a value indicating a position of a last significant coefficient within a video block of size T, determine a first binary string for the value indicating the position of the last significant coefficient based on a truncated unary coding scheme defined by a maximum bit length defined by $2 \log_2(T)-1$, determine a second binary string for the value indicating the position of the last significant coefficient based on a fixed length coding scheme and encode the first and second binary strings to a bitstream.

In another example, a computer-readable storage medium comprises instructions stored thereon that, when executed, cause a processor of a device for decoding video data to obtain a first binary string and a second binary string from an encoded bitstream, determine a value indicating the position of a last significant coefficient within a video block of size T based in part on the first binary string, wherein the first binary string is defined by a truncated unary coding scheme with a maximum bit length defined by $2 \log_2(T)-1$ and determine the value indicating the position of the last significant coefficient based in part on the second binary string, wherein the second binary string is defined by a fixed length coding scheme.

In one example, a method for decoding video data comprises obtaining a first binary string and a second binary string from an encoded bitstream, determining a value indicating the position of a last significant coefficient within a video block of size T based in part on the first binary string, wherein the first binary string is defined by a truncated unary coding scheme with a maximum bit length defined by $\log_2(T)+1$ and determining the value indicating the position of the last significant coefficient based in part on the second binary string, wherein the second binary string is defined by a fixed length coding scheme.

In one example, a method for decoding video data comprises obtaining a first binary string and a second binary string from an encoded bitstream, determining a value indicating the position of a last significant coefficient within a video block of size T based in part on the first binary string, wherein the first binary string is defined by a truncated unary coding scheme with a maximum bit length defined by $\log_2(T)$ and determining the value indicating the position of the last significant coefficient based in part on the second binary string, wherein the second binary string is defined by a fixed length coding scheme.

The details of one or more examples are set forth in the accompanying drawings and the description below. Other features, objects, and advantages will be apparent from the description and drawings, and from the claims.

DETAILED DESCRIPTION

This disclosure provides techniques for reducing the length of a bit string used for indicating the position of the last significant coefficient position within a block of transform coefficients. The bit string may be particularly useful for context adaptive binary arithmetic coding (CABAC). In one example, a progressive codeword structure with a reduced number of bins and shorter truncated unary codes may be used to indicate the position of the last significant coefficient position. Additionally, in one example, by reducing the maximum length of the truncate unary code the number of CABAC context models for the last significant coefficient position may also be reduced.

A video encoder may be configured to determine a first and second binary string for a value indicating the position of the last significant coefficient, within a video block of size T. A video decoder may be configured to determine a value indicating the position of a last significant coefficient within a video block of size T based on a first and second binary string. In one example, the first binary string may be based on a truncated unary coding scheme defined by a maximum bit length defined by $2 \log_2(T)-1$ and the second binary string may be based on a fixed length coding scheme defined by a maximum bit length defined by $\log_2(T)-2$. In another example, the first binary string may be based on a truncated unary coding scheme defined by a maximum bit length defined by $\log_2(T)+1$ and the second binary string may be based on a fixed length coding scheme defined by a maximum bit length defined by $\log_2(T)-1$. In yet another example, the first binary string may be based on a truncated unary coding scheme defined by a maximum bit length defined by $\log_2(T)$ and the second binary string may be based on a fixed length coding scheme defined by a maximum bit length defined by $\log_2(T)-1$.

FIG. 1 is a block diagram illustrating an example video encoding and decoding system 10 that may utilize the techniques described in this disclosure. As shown in FIG. 1, system 10 includes a source device 12 that generates encoded video data to be decoded at a later time by a destination device 14. Source device 12 and destination device 14 may comprise any of a wide range of devices, including desktop computers, notebook (i.e., laptop) computers, tablet computers, set-top boxes, telephone handsets such as so-called "smart" phones, so-called "smart" pads, televisions, cameras, display devices, digital media players, video gaming consoles, video streaming device, or the like. In some cases, source device 12 and destination device 14 may be equipped for wireless communication.

Destination device 14 may receive the encoded video data to be decoded via a link 16. Link 16 may comprise any type of medium or device capable of moving the encoded video data from source device 12 to destination device 14. In one example, link 16 may comprise a communication medium to enable source device 12 to transmit encoded video data directly to destination device 14 in real-time. The encoded video data may be modulated according to a communication standard, such as a wireless communication protocol, and transmitted to destination device 14. The communication medium may comprise any wireless or wired communication medium, such as a radio frequency (RF) spectrum or one or more physical transmission lines. The communication medium may form part of a packet-based network, such as a local area network, a wide-area network, or a global network such as the Internet. The communication medium may include routers, switches, base stations, or any other equipment that may be useful to facilitate communication from source device 12 to destination device 14.

Alternatively, encoded data may be output from output interface 22 to a storage device 32. Similarly, encoded data may be accessed from storage device 32 by input interface 28. Storage device 32 may include any of a variety of distributed or locally accessed data storage media such as a hard drive, Blu-ray discs, DVDs, CD-ROMs, flash memory, volatile or non-volatile memory, or any other suitable digital storage media for storing encoded video data. In a further example, storage device 32 may correspond to a file server or another intermediate storage device that may hold the encoded video generated by source device 12. Destination device 14 may access stored video data from storage device 32 via streaming or download. The file server may be any type of server capable of storing encoded video data and transmitting that encoded video data to the destination device 14. Example file servers include a web server (e.g., for a website), an FTP server, network attached storage (NAS) devices, or a local disk drive. Destination device 14 may access the encoded video data through any standard data connection, including an Internet connection. This may include a wireless channel (e.g., a Wi-Fi connection), a wired connection (e.g., DSL, cable modem, etc.), or a combination of both that is suitable for accessing encoded video data stored on a file server. The transmission of encoded video data from storage device 32 may be a streaming transmission, a download transmission, or a combination of both.

The techniques of this disclosure are not necessarily limited to wireless applications or settings. The techniques may be applied to video coding in support of any of a variety of multimedia applications, such as over-the-air television broadcasts, cable television transmissions, satellite television transmissions, streaming video transmissions, e.g., via the Internet, encoding of digital video for storage on a data storage medium, decoding of digital video stored on a data storage medium, or other applications. In some examples, system 10 may be configured to support one-way or two-way video transmission to support applications such as video streaming, video playback, video broadcasting, and/or video telephony.

In the example of FIG. 1, source device 12 includes a video source 18, video encoder 20 and an output interface 22. In some cases, output interface 22 may include a modulator/demodulator (modem) and/or a transmitter. In source device 12, video source 18 may include a source such as a video capture device, e.g., a video camera, a video archive containing previously captured video, a video feed interface to receive video from a video content provider, and/or a computer graphics system for generating computer graphics data as the source video, or a combination of such sources. As one example, if video source 18 is a video camera, source device 12 and destination device 14 may form so-called camera phones or video phones. However, the techniques described in this disclosure may be applicable to video coding in general, and may be applied to wireless and/or wired applications.

The captured, pre-captured, or computer-generated video may be encoded by video encoder 12. The encoded video data may be transmitted directly to destination device 14 via output interface 22 of source device 20. The encoded video data may also (or alternatively) be stored onto storage device 32 for later access by destination device 14 or other devices, for decoding and/or playback.

Destination device 14 includes an input interface 28, a video decoder 30, and a display device 32. In some cases, input interface 28 may include a receiver and/or a modem. Input interface 28 of destination device 14 receives the encoded video data over link 16. The encoded video data communicated over link 16, or provided on storage device 32, may include a variety of syntax elements generated by video encoder 20 for use by a video decoder, such as video decoder 30, in decoding the video data. Such syntax elements may be included with the encoded video data transmitted on a communication medium, stored on a storage medium, or stored a file server.

Display device 32 may be integrated with, or external to, destination device 14. In some examples, destination device 14 may include an integrated display device and also be configured to interface with an external display device. In other examples, destination device 14 may be a display device. In general, display device 32 displays the decoded video data to a user, and may comprise any of a variety of display devices such as a liquid crystal display (LCD), a plasma display, an organic light emitting diode (OLED) display, or another type of display device.

Video encoder 20 and video decoder 30 may operate according to a video compression standard, such as the High Efficiency Video Coding (HEVC) standard presently under development, and may conform to the HEVC Test Model (HM). Alternatively, video encoder 20 and video decoder 30 may operate according to other proprietary or industry standards, such as the ITU-T H.264 standard, alternatively referred to as MPEG-4, Part 10, Advanced Video Coding (AVC), or extensions of such standards. The techniques of this disclosure, however, are not limited to any particular coding standard. Other examples of video compression standards include MPEG-2 and ITU-T H.263.

Although not shown in FIG. 1, in some aspects, video encoder 20 and video decoder 30 may each be integrated with an audio encoder and decoder, and may include appropriate MUX-DEMUX units, or other hardware and software, to handle encoding of both audio and video in a common data stream or separate data streams. If applicable, in some examples, MUX-DEMUX units may conform to the ITU H.223 multiplexer protocol, or other protocols such as the user datagram protocol (UDP).

Video encoder 20 and video decoder 30 each may be implemented as any of a variety of suitable encoder circuitry, such as one or more microprocessors, digital signal processors (DSPs), application specific integrated circuits (ASICs), field programmable gate arrays (FPGAs), discrete logic, software, hardware, firmware or any combinations thereof. When the techniques are implemented partially in software, a device may store instructions for the software in a suitable, non-transitory computer-readable medium and execute the instructions in hardware using one or more processors to perform the techniques of this disclosure. Each of video encoder 20 and video decoder 30 may be included in one or more encoders or decoders, either of which may be integrated as part of a combined encoder/decoder (CODEC) in a respective device.

The JCT-VC is working on development of the HEVC standard. The HEVC standardization efforts are based on an evolving model of a video coding device referred to as the HEVC Test Model (HM). The HM presumes several additional capabilities of video coding devices relative to existing devices according to, e.g., ITU-T H.264/AVC. For example, whereas H.264 provides nine intra-prediction encoding modes, the HM may provide as many as thirty-three intra-prediction encoding modes.

In general, the working model of the HM describes that a video frame or picture may be divided into a sequence of treeblocks or largest coding units (LCU) that include both luma and chroma samples. A treeblock has a similar purpose as a macroblock of the H.264 standard. A slice includes a number of consecutive treeblocks in coding order. A video frame or picture may be partitioned into one or more slices. Each treeblock may be split into coding units (CUs) according to a quadtree. For example, a treeblock, as a root node of the quadtree, may be split into four child nodes, and each child node may in turn be a parent node and be split into another four child nodes. A final, unsplit child node, as a leaf node of the quadtree, comprises a coding node, i.e., a coded video block. Syntax data associated with a coded bitstream may define a maximum number of times a treeblock may be split, and may also define a minimum size of the coding nodes.

A CU includes a coding node and prediction units (PUs) and transform units (TUs) associated with the coding node. A size of the CU corresponds to a size of the coding node and must be square in shape. The size of the CU may range from 8×8 pixels up to the size of the treeblock with a maximum of 64×64 pixels or greater. Each CU may contain one or more PUs and one or more TUs. Syntax data associated with a CU may describe, for example, partitioning of the CU into one or more PUs. Partitioning modes may differ between whether the CU is skip or direct mode encoded, intra-prediction mode encoded, or inter-prediction mode encoded. PUs may be partitioned to be non-square in shape. Syntax data associated with a CU may also describe, for example, partitioning of the CU into one or more TUs according to a quadtree. A TU can be square or non-square in shape.

The HEVC standard allows for transformations according to TUs, which may be different for different CUs. The TUs are typically sized based on the size of PUs within a given CU defined for a partitioned LCU, although this may not always be the case. The TUs are typically the same size or smaller than the PUs. In some examples, residual samples corresponding to a CU may be subdivided into smaller units using a quadtree structure known as "residual quad tree" (RQT). The leaf nodes of the RQT may be referred to as transform units (TUs). Pixel difference values associated with the TUs may be transformed to produce transform coefficients, which may be quantized.

In general, a PU includes data related to the prediction process. For example, when the PU is intra-mode encoded, the PU may include data describing an intra-prediction mode for the PU. As another example, when the PU is inter-mode encoded, the PU may include data defining a motion vector for the PU. The data defining the motion vector for a PU may describe, for example, a horizontal component of the motion vector, a vertical component of the motion vector, a resolution for the motion vector (e.g., one-quarter pixel precision or one-eighth pixel precision), a reference picture to which the motion vector points, and/or a reference picture list (e.g., List 0, List 1, or List C) for the motion vector.

In general, a TU is used for the transform and quantization processes. A given CU having one or more PUs may also include one or more TUs. Following prediction, video encoder 20 may calculate residual values corresponding to the PU. The residual values comprise pixel difference values that may be transformed into transform coefficients, quantized, and scanned using the TUs to produce serialized transform coefficients for entropy coding. The term "video block" in this disclosure may refer to a coding node of a CU, or a block of transform coefficients. One or more blocks of transform coefficients may define a TU. In some specific cases, this disclosure may also use the term "video block" to refer to a treeblock, i.e., LCU, or a CU, which includes a coding node and PUs and TUs.

A video sequence typically includes a series of video frames or pictures. A group of pictures (GOP) generally comprises a series of one or more of the video pictures. A GOP may include syntax data in a header of the GOP, a header of one or more of the pictures, or elsewhere, that describes a number of pictures included in the GOP. Each slice of a picture may include slice syntax data that describes an encoding mode for the respective slice. Video encoder 20 typically operates on video blocks within individual video slices in order to encode the video data. A video block may include one or more TUs or PUs that correspond to a coding node within a CU. The video blocks may have fixed or varying sizes, and may differ in size according to a specified coding standard.

As an example, the HM supports prediction in various PU sizes. Assuming that the size of a particular CU is 2N×2N, the HM supports intra-prediction in PU sizes of 2N×2N or N×N, and inter-prediction in symmetric PU sizes of 2N×2N, 2N×N, N×2N, or N×N. The HM also supports asymmetric partitioning for inter-prediction in PU sizes of 2N×nU, 2N×nD, nL×2N, and nR×2N. In asymmetric partitioning, one direction of a CU is not partitioned, while the other direction is partitioned into 25% and 75%. The portion of the CU corresponding to the 25% partition is indicated by an "n" followed by an indication of "Up", "Down," "Left," or "Right." Thus, for example, "2N×nU" refers to a 2N×2N CU that is partitioned horizontally with a 2N×0.5N PU on top and a 2N×1.5N PU on bottom.

In this disclosure, "N×N" and "N by N" may be used interchangeably to refer to the pixel dimensions of a video block in terms of vertical and horizontal dimensions, e.g., 16×16 pixels or 16 by 16 pixels. In general, a 16×16 block will have 16 pixels in a vertical direction (y=16) and 16 pixels in a horizontal direction (x=16). Likewise, an N×N block generally has N pixels in a vertical direction and N pixels in a horizontal direction, where N represents a nonnegative integer value. The pixels in a block may be arranged in rows and columns. Moreover, blocks need not necessarily have the same number of pixels in the horizontal direction as in the vertical direction. For example, blocks may comprise N×M pixels, where M is not necessarily equal to N.

Following intra-predictive or inter-predictive coding using the PUs of a CU, video encoder 20 may calculate residual data for the TUs of the CU. The PUs may comprise pixel data in the spatial domain (also referred to as the pixel domain) and the TUs may comprise coefficients in the transform domain following application of a transform, e.g., a discrete cosine transform (DCT), an integer transform, a wavelet transform, or a conceptually similar transform to residual video data. The residual data may correspond to pixel differences between pixels of the unencoded picture and prediction values corresponding to the PUs. Video encoder 20 may form the TUs from one or more blocks of transform coefficients. TUs may include the residual data for the CU. Video encoder 20 may then transform the TUs to produce transform coefficients for the CU.

Following any transforms to produce transform coefficients, video encoder 20 may perform quantization of the transform coefficients. Quantization generally refers to a process in which transform coefficients are quantized to possibly reduce the amount of data used to represent the coefficients, providing further compression. The quantization process may reduce the bit depth associated with some or all of the coefficients. For example, an n-bit value may be rounded down to an m-bit value during quantization, where n is greater than m.

Figure 2A:
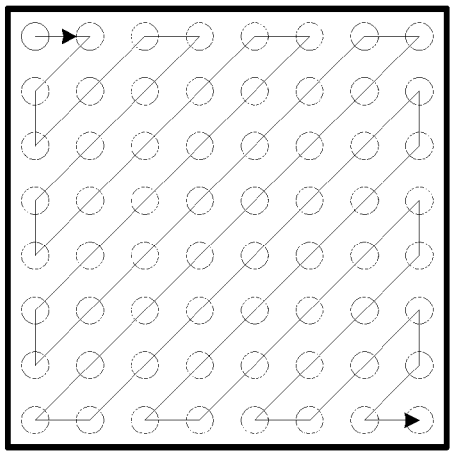
FIGS. 2A-2D illustrate exemplary coefficient value scan orders.
Figure 2B:
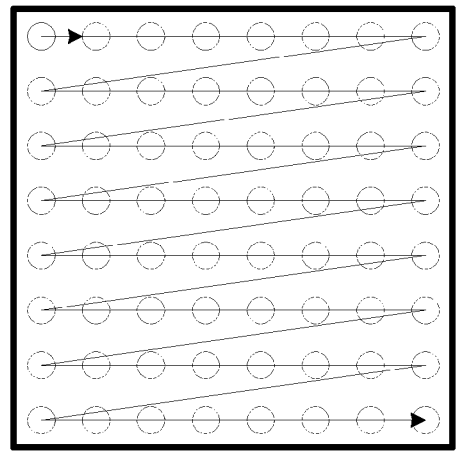
Figure 2C:
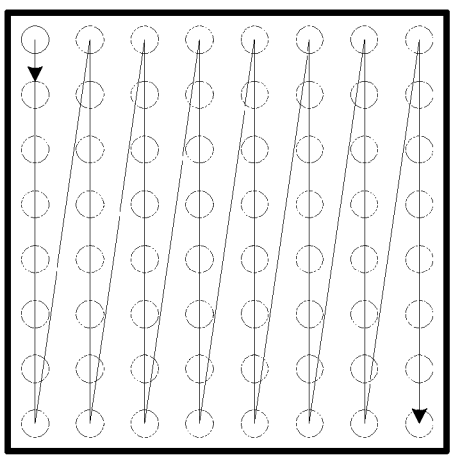
Figure 2D:
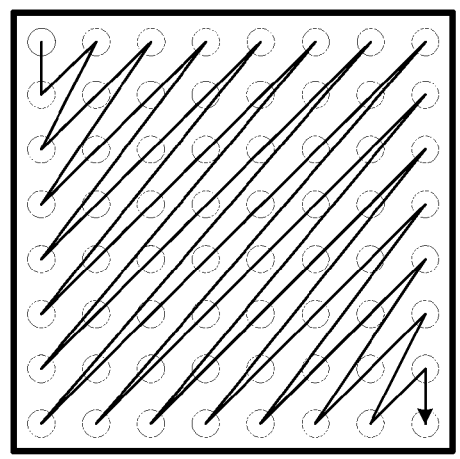

In some examples, video encoder 20 may utilize a predefined scan order to scan the quantized transform coefficients to produce a serialized vector that can be entropy encoded. In other examples, video encoder 20 may perform an adaptive scan. FIGS. 2A-2D illustrate some different exemplary scan orders. Other defined scan orders, or adaptive (changing) scan orders may also be used. FIG. 2A illustrates a zig-zag scan order, FIG. 2B illustrates a horizontal scan order, FIG. 2C illustrates a vertical scan orders, and FIG. 2D illustrates a diagonal scan order. Combinations of these scan orders can also be defined and used. In some examples, the techniques of this disclosure may be specifically applicable during coding of a so-called significance map in the video coding process.

One or more syntax elements may be defined to indicate a position of a last significant coefficient (i.e. non-zero coefficient), which may depend on the scan order associated with a block of coefficients. For example, one syntax element may define a column position of a last significant coefficient within a block of coefficient values and another syntax element may define a row position of the last significant coefficient within a block of coefficient values.

Figure 3:
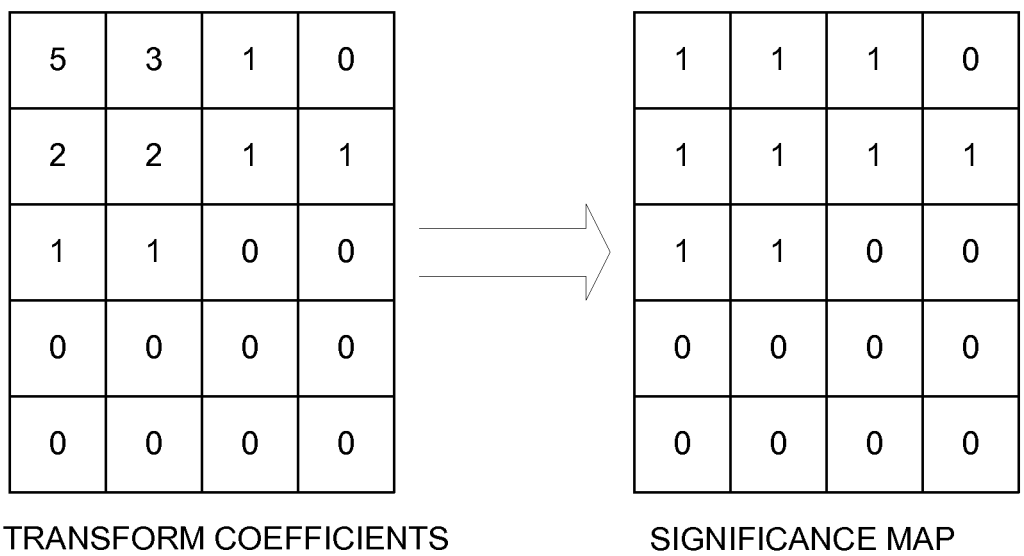
FIG. 3 illustrates one example of a significance map relative to a block of coefficient values.

FIG. 3 illustrates one example of a significance map relative to a block of coefficient values. The significance map is shown on the right, in which one-bit flags identify the coefficients in the video block on the left that are significant, i.e., non-zero. In one example, given a set of significant coefficients (e.g., defined by a significance map) and a scan order, a position of a last significant coefficient may be defined. In the emerging HEVC standard, transform coefficients may be grouped into a chunk. The chunk may comprise an entire TU, or in some cases, TUs may be sub-divided into smaller chunks. The significance map and level information (absolute value and sign) are coded for each coefficient in a chunk. In one example, a chunk consists of 16 consecutive coefficients in an inverse scan order (e.g., diagonal, horizontal, or vertical) for a 4×4 TU and an 8×8 TU. For 16×16 and 32×32 TUs, the coefficients within a 4×4 sub-block are treated as a chunk. The syntax elements are coded and signaled to represent the coefficients level information within a chunk. In one example, all the symbols are encoded in an inverse scan order. The techniques of this disclosure may improve the coding of a syntax element used to define this position of the last significant coefficient of a block of coefficients.

As one example, the techniques of this disclosure may be used to code the position of the last significant coefficient of a block of coefficients (e.g., a TU or a chunk of a TU). Then, after coding the position of the last significant coefficient, the level and sign information may be coded. The coding of the level and sign information may process according to a five pass approach by coding the following symbols in inverse scan order (e.g., for a TU or a chunk of the TU):

significant_coeff_flag (abbr. sigMapFlag): this flag may indicate the significance of each coefficient in a chunk. A coefficient with a value of one or greater is consider to be significant.

coeff_abs_level_greater1_flag (abbr. gr1Flag): this flag may indicate whether the absolute value of the coefficient is larger than one for the non-zero coefficients (i.e. coefficients with sigMapFlag as 1).

coeff_abs_level_greater2_flag (abbr. gr2Flag): this flag may indicate whether the absolute value of the coefficient is larger than two for the coefficients with an absolute value larger than one (i.e. coefficients with gr1Flag as 1).

coeff_sign_flag (abbr. signFlag): this flag may indicate the sign information for the non-zero coefficients. For example, a zero for this flag indicates a positive sign, while a 1 indicates a negative sign.

coeff_abs_level_remain (abbr. levelRem): is the remaining absolute value of a transform coefficient level. For this flag, the absolute value of the coefficient—x is coded (abs(level)−x) for each coefficient with the amplitude larger than x the value of x depends on the presents of gr1Flag and gr2Flag.

In this manner, transform coefficients for a TU or a chunk of a TU can be coded. In any case, the techniques of this disclosure, which concern the coding of a syntax element used to define the position of the last significant coefficient of a block of coefficients, may also be used with other types of techniques for ultimately coding the level and sign information of transform coefficients. The five pass approach for coding significance, level and sign information is just one example technique that may be used following the coding of the position of the last significant coefficient of a block, as set forth in this disclosure.

After scanning the quantized transform coefficients to form a one-dimensional vector, video encoder 20 may entropy encode the one-dimensional vector, e.g., according to context adaptive variable length coding (CAVLC), context adaptive binary arithmetic coding (CABAC), syntax-based context-adaptive binary arithmetic coding (SBAC), Probability Interval Partitioning Entropy (PIPE) coding or another entropy encoding methodology. Video encoder 20 may also entropy encode syntax elements associated with the encoded video data for use by video decoder 30 in decoding the video data. The entropy coding techniques of this disclosure are specifically described as being applicable to CABAC, although the techniques may also be applicable to other entropy coding techniques such as CAVLC, SBAC, PIPE, or other techniques.

To perform CABAC, video encoder 20 may assign a context within a context model to a symbol to be transmitted. The context may relate to, for example, whether neighboring values of the symbol are non-zero or not. To perform CAVLC, video encoder 20 may select a variable length code for a symbol to be transmitted. Codewords in variable length coding (VLC) may be constructed such that relatively shorter codes correspond to more probable symbols, while longer codes correspond to less probable symbols. In this way, the use of VLC may achieve a bit savings over, for example, using equal-length codewords for each symbol to be transmitted. The probability determination may be based on a context assigned to the symbol.

In general, coding data symbols using CABAC may involve one or more of the following steps:

(1) Binarization: If a symbol to be coded is non-binary valued, it is mapped to a sequence of so-called "bins." Each bin can have a value of "0" or "1."

(2) Context Assignment: Each bin (in regular mode) is assigned to a context. A context model determines how a context for a given bin is calculated based on information available for the bin, such as values of previously encoded symbols or bin number.

(3) Bin encoding: Bins are encoded with an arithmetic encoder. To encode a bin, the arithmetic encoder requires as an input a probability of the bin's value, i.e., a probability that the bin's value is equal to "0," and a probability that the bin's value is equal to "1." The (estimated) probability of each context is represented by an integer value called a "context state." Each context has a state, and thus the state (i.e., estimated probability) is the same for bins assigned to one context, and differs between contexts.

(4) State update: The probability (state) for a selected context is updated based on the actual coded value of the bin (e.g., if the bin value was "1," the probability of "1's" is increased).

It should be noted that probability interval partitioning entropy coding (PIPE) uses principles similar to those of arithmetic coding, and may utilize similar techniques to those of this disclosure, which are primarily described with respect to CABAC. The techniques of this disclosure, however, may be used with CABAC, PIPE or other entropy coding methodologies that use binarization techniques.

One technique recently adopted to HM4.0 is described in V. Seregin, I.-K Kim, "Binarisation modification for last position coding", JCTVC-F375, 6$^{th}$ JCT-VC Meeting, Torino, IT, Jul., 2011 (herein "Seregin"). The technique adopted in HM4.0 reduces the contexts used in last position coding for CABAC by introducing fixed length codes with bypass mode. Bypass mode means that there is no context modelling procedure and every symbol is coded with equal probability state. Increasing the number of bins coded in bypass mode while reducing the bins in regular mode may help the speed-up and parallelization of the codec.

In the technique adopted in HM4.0, the maximum possible magnitude of last position component, max_length, is divided equally in two halves. The first half is coded with a truncated unary code and the second half is coded with fixed length codes (the number of bins being equal to $\log_2(\text{max\_length}/2)$). In the worst case scenario, the number of the bins that use context modelling is equal to max_length/2. Table 1 shows the binarization for TU 32×32 in HM4.0.

TABLE 1

Binarization for TU 32x32 in HM4.0, where X means 1 or 0.

| Magnitude of last position component | Truncated unary (context model) | Fixed binary (bypass) |
|---|---|---|
| 0 | 1 | — |
| 1 | 01 | — |
| 2 | 001 | — |
| 3 | 0001 | — |
| 4 | 00001 | — |
| 5 | 000001 | — |
| 6 | 0000001 | — |
| 7 | 00000001 | — |
| 8 | 000000001 | — |
| 9 | 0000000001 | — |
| 10 | 00000000001 | — |
| 11 | 000000000001 | — |
| 12 | 0000000000001 | — |
| 13 | 00000000000001 | — |
| 14 | 000000000000001 | — |
| 15 | 0000000000000001 | — |
| 16-31 | 0000000000000000 | XXXX |

This disclosure provide techniques for the context adaptive binary arithmetic coding (CABAC) of the last significant coefficient position. In one example, a progressive codeword structure with reduced number of bins and shorter truncated unary codes may be used. Additionally, in one example, by reducing the maximum length of the truncate unary code the number of context models for the last significant coefficient position may be reduced by two.

Figure 4:
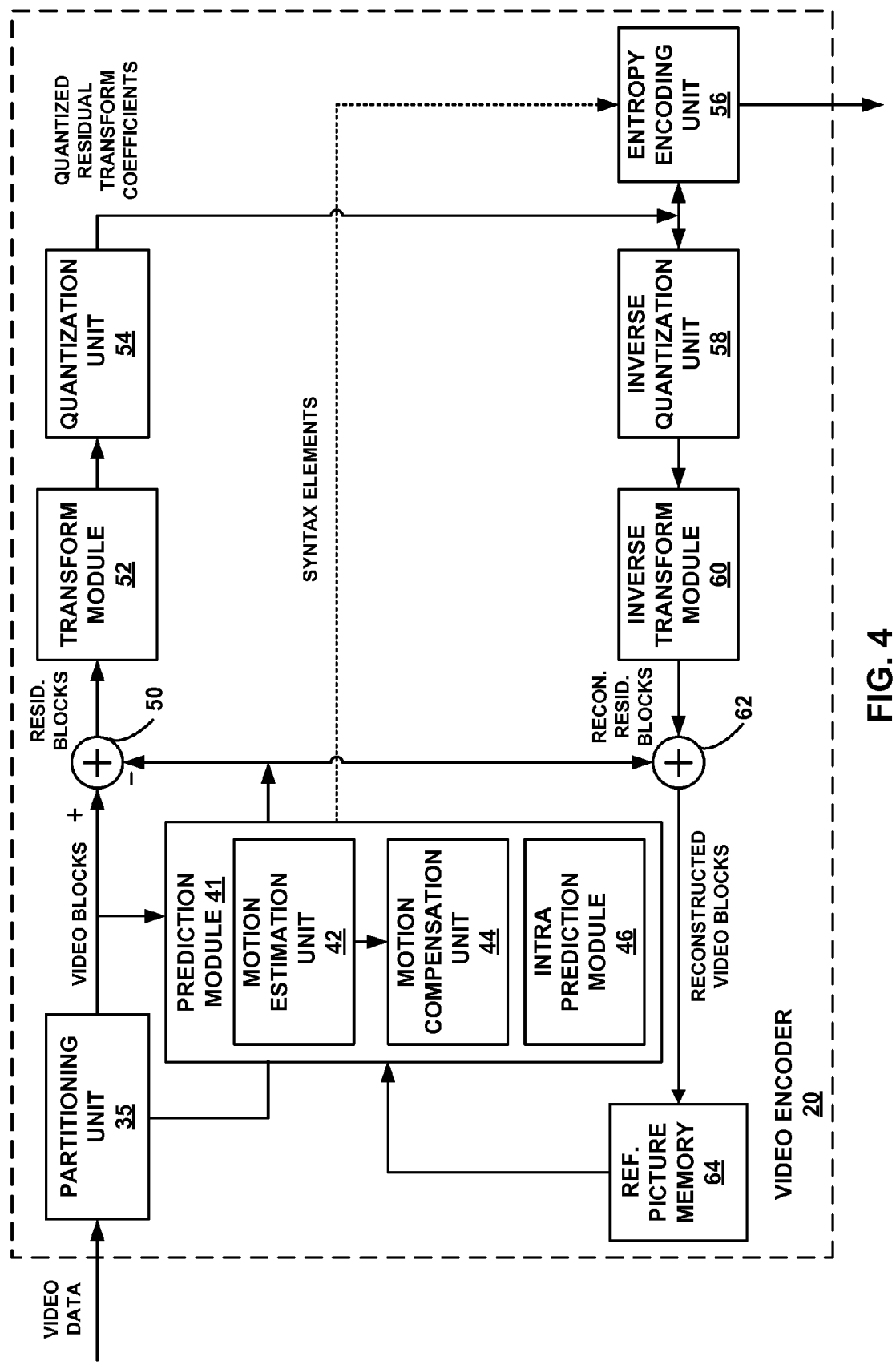
FIG. 4 is a block diagram illustrating an example video encoder that may implement the techniques described in this disclosure.

FIG. 4 is a block diagram illustrating an example video encoder 20 that may implement the techniques described in this disclosure. Video encoder 20 may perform intra- and inter-coding of video blocks within video slices. Intra-coding relies on spatial prediction to reduce or remove spatial redundancy in video within a given video frame or picture. Inter-coding relies on temporal prediction to reduce or remove temporal redundancy in video within adjacent frames or pictures of a video sequence. Intra-mode (I mode) may refer to any of several spatial based compression modes. Inter-modes, such as uni-directional prediction (P mode) or bi-prediction (B mode), may refer to any of several temporal-based compression modes.

In the example of FIG. 4, video encoder 20 includes a partitioning unit 35, prediction module 41, reference picture memory 64, summer 50, transform module 52, quantization unit 54, and entropy encoding unit 56. Prediction module 41 includes motion estimation unit 42, motion compensation unit 44, and intra prediction module 46. For video block reconstruction, video encoder 20 also includes inverse quantization unit 58, inverse transform module 60, and summer 62. A deblocking filter (not shown in FIG. 2) may also be included to filter block boundaries to remove blockiness artifacts from reconstructed video. If desired, the deblocking filter would typically filter the output of summer 62. Additional loop filters (in loop or post loop) may also be used in addition to the deblocking filter.

As shown in FIG. 4, video encoder 20 receives video data, and partitioning unit 35 partitions the data into video blocks. This partitioning may also include partitioning into slices, tiles, or other larger units, as wells as video block partitioning, e.g., according to a quadtree structure of LCUs and CUs. Video encoder 20 generally illustrates the components that encode video blocks within a video slice to be encoded. The slice may be divided into multiple video blocks (and possibly into sets of video blocks referred to as tiles). Prediction module 41 may select one of a plurality of possible coding modes, such as one of a plurality of intra coding modes or one of a plurality of inter coding modes, for the current video block based on error results (e.g., coding rate and the level of distortion). Prediction module 41 may provide the resulting intra- or inter-coded block to summer 50 to generate residual block data and to summer 62 to reconstruct the encoded block for use as a reference picture.

Intra prediction module 46 within prediction module 41 may perform intra-predictive coding of the current video block relative to one or more neighboring blocks in the same frame or slice as the current block to be coded to provide spatial compression. Motion estimation unit 42 and motion compensation unit 44 within prediction module 41 perform inter-predictive coding of the current video block relative to one or more predictive blocks in one or more reference pictures to provide temporal compression.

Motion estimation unit 42 may be configured to determine the inter-prediction mode for a video slice according to a predetermined pattern for a video sequence. The predetermined pattern may designate video slices in the sequence as predictive slices (P slices), bipredictive slices (B slices) or generalized P and B slices (GPB slices). A P slice may reference a previous sequential picture. A B slice may reference a previous sequential picture or a post sequential picture. GPB slices refer to a case where two lists of reference pictures are identical. Motion estimation unit 42 and motion compensation unit 44 may be highly integrated, but are illustrated separately for conceptual purposes. Motion estimation, performed by motion estimation unit 42, is the process of generating motion vectors, which estimate motion for video blocks. A motion vector, for example, may indicate the displacement of a PU of a video block within a current video frame or picture relative to a predictive block within a reference picture.

A predictive block is a block that is found to closely match the PU of the video block to be coded in terms of pixel difference, which may be determined by sum of absolute difference (SAD), sum of square difference (SSD), or other difference metrics. In some examples, video encoder 20 may calculate values for sub-integer pixel positions of reference pictures stored in reference picture memory 64. For example, video encoder 20 may interpolate values of one-quarter pixel positions, one-eighth pixel positions, or other fractional pixel positions of the reference picture. Therefore, motion estimation unit 42 may perform a motion search relative to the full pixel positions and fractional pixel positions and output a motion vector with fractional pixel precision.

Motion estimation unit 42 calculates a motion vector for a PU of a video block in an inter-coded slice by comparing the position of the PU to the position of a predictive block of a reference picture. The reference picture may be selected from a first reference picture list (List 0) or a second reference picture list (List 1), each of which identify one or more reference pictures stored in reference picture memory 64. Motion estimation unit 42 sends the calculated motion vector to entropy encoding unit 56 and motion compensation unit 44.

Motion compensation, performed by motion compensation unit 44, may involve fetching or generating the predictive block based on the motion vector determined by motion estimation, possibly performing interpolations to sub-pixel precision. Upon receiving the motion vector for the PU of the current video block, motion compensation unit 44 may locate the predictive block to which the motion vector points in one of the reference picture lists. Video encoder 20 forms a residual video block by subtracting pixel values of the predictive block from the pixel values of the current video block being coded, forming pixel difference values. The pixel difference values form residual data for the block, and may include both luma and chroma difference components. Summer 50 represents the component or components that perform this subtraction operation. Motion compensation unit 44 may also generate syntax elements associated with the video blocks and the video slice for use by video decoder 30 in decoding the video blocks of the video slice.

Intra-prediction module 46 may intra-predict a current block, as an alternative to the inter-prediction performed by motion estimation unit 42 and motion compensation unit 44, as described above. In particular, intra-prediction module 46 may determine an intra-prediction mode to use to encode a current block. In some examples, intra-prediction module 46 may encode a current block using various intra-prediction modes, e.g., during separate encoding passes, and intra-prediction module 46 (or mode select unit 40, in some examples) may select an appropriate intra-prediction mode to use from the tested modes. For example, intra-prediction module 46 may calculate rate-distortion values using a rate-distortion analysis for the various tested intra-prediction modes, and select the intra-prediction mode having the best rate-distortion characteristics among the tested modes. Rate-distortion analysis generally determines an amount of distortion (or error) between an encoded block and an original, unencoded block that was encoded to produce the encoded block, as well as a bit rate (that is, a number of bits) used to produce the encoded block. Intra-prediction module 46 may calculate ratios from the distortions and rates for the various encoded blocks to determine which intra-prediction mode exhibits the best rate-distortion value for the block.

In any case, after selecting an intra-prediction mode for a block, intra-prediction module 46 may provide information indicative of the selected intra-prediction mode for the block to entropy coding unit 56. Entropy coding unit 56 may encode the information indicating the selected intra-prediction mode in accordance with the techniques of this disclosure. Video encoder 20 may include in the transmitted bitstream configuration data, which may include a plurality of intra-prediction mode index tables and a plurality of modified intra-prediction mode index tables (also referred to as codeword mapping tables), definitions of encoding contexts for various blocks, and indications of a most probable intra-prediction mode, an intra-prediction mode index table, and a modified intra-prediction mode index table to use for each of the contexts.

After prediction module 41 generates the predictive block for the current video block via either inter-prediction or intra-prediction, video encoder 20 forms a residual video block by subtracting the predictive block from the current video block. The residual video data in the residual block may be included in one or more TUs and applied to transform module 52. Transform module 52 transforms the residual video data into residual transform coefficients using a transform, such as a discrete cosine transform (DCT) or a conceptually similar transform. Transform module 52 may convert the residual video data from a pixel domain to a transform domain, such as a frequency domain.

Transform module 52 may send the resulting transform coefficients to quantization unit 54. Quantization unit 54 quantizes the transform coefficients to further reduce bit rate. The quantization process may reduce the bit depth associated with some or all of the coefficients. The degree of quantization may be modified by adjusting a quantization parameter. In some examples, quantization unit 54 may then perform a scan of the matrix including the quantized transform coefficients. Alternatively, entropy encoding unit 56 may perform the scan. Inverse quantization unit 58 and inverse transform module 60 apply inverse quantization and inverse transformation, respectively, to reconstruct the residual block in the pixel domain for later use as a reference block of a reference picture. Motion compensation unit 44 may calculate a reference block by adding the residual block to a predictive block of one of the reference pictures within one of the reference picture lists. Motion compensation unit 44 may also apply one or more interpolation filters to the reconstructed residual block to calculate sub-integer pixel values for use in motion estimation. Summer 62 adds the reconstructed residual block to the motion compensated prediction block produced by motion compensation unit 44 to produce a reference block for storage in reference picture memory 64. The reference block may be used by motion estimation unit 42 and motion compensation unit 44 as a reference block to inter-predict a block in a subsequent video frame or picture.

Following quantization, entropy encoding unit 56 entropy encodes the quantized transform coefficients. For example, entropy encoding unit 56 may perform context adaptive variable length coding (CAVLC), context adaptive binary arithmetic coding (CABAC), syntax-based context-adaptive binary arithmetic coding (SBAC), probability interval partitioning entropy (PIPE) coding or another entropy encoding methodology or technique. Following the entropy encoding by entropy encoding unit 56, the encoded bitstream may be transmitted to video decoder 30, or archived for later transmission or retrieval by video decoder 30. Entropy encoding unit 56 may also entropy encode the motion vectors and the other syntax elements for the current video slice being coded.

In one example, entropy coding unit 56 may encode the position of a last significant coefficient using the technique adopted in HM4.0 described above. In other examples, entropy coding unit 56 may encode the position of a last significant coefficient using the techniques that may provide improved coding. In particular, entropy coding unit 56 may utilize a progressive last position coding scheme for several possible TU sizes.

In one example, a codeword for the position of a last significant coefficient may include a truncated unary code prefix followed by a fixed length code suffix. In one example, each magnitude of last position may use the same binarization for all possible TU sizes, except when the last position equals to TU size minus 1. This exception is due to the properties of truncated unary coding. In one example, the position of a last significant coefficient within a rectangular transform coefficient may be specified by specifying an x-coordinate value and a y-coordinate value. In another example, a transform coefficient block may be in the form of a 1×N vector and the position of the last significant coefficient within the vector may be specified by a signal position value.

In one example, T may define the size of a TU. As described in detail above, a TU may be square or non-square in shape. Thus, T may refer to either the number of rows or columns of a two dimension TU or the length of a vector. In an example where a truncated unary coding scheme provides a number of zero bits followed by a one bit, the number of zeros of a truncated unary code prefix coding the position of a last significant coefficient may be defined according to $N=\{0, \ldots, 2\log_2(T)-1\}$. It should be noted that in an example where a truncated unary coding scheme provides a number of one bits followed by a zero bit, $N=\{0, \ldots, 2\log_2(T)-1\}$ may also define the number of ones. In each of these truncated unary coding alternatives, $2\log_2(T)-1$ may define the maximum length of a truncated unary prefix for a TU of size T. For example, for a TU where T equals 32, the maximum length of the truncated unary prefix is equal to nine and where T equals 16, the maximum length of the truncated unary prefix is equal to seven.

For a truncated unary code, value n, a fixed length code suffix may include the following b bits of fixed length binary code with a value of defined as follows: $f\_value=\{0, \ldots, 2^b-1\}$, where $b=\max(0, n/2-1)$. Thus, the magnitude of last position, last_pos, can be derived from n and f_value as:

$$\text{last\_pos} = \begin{cases} n, & \text{if } n < 2 \\ 2^{\frac{n}{2}-1} \times (2 + \mod(n, 2)) + \text{f\_value}, & \text{if } n \geq 2 \end{cases} \quad (1)$$

where mod(.) represents modular operation and f_value represents the value of the fixed length code.

Table 2 shows of an example binarization of a position of a last significant coefficient according to the definitions provided according to Equation 1 for a 32×32 TU. The second column of Table 2 provides for corresponding truncated unary prefix values for possible values of the position of a last significant coefficient within a TU of size T of defined by the maximum truncated unary prefix length of $2\log_2(T)-1$. The third column of Table 2 provides a corresponding fixed length suffix for each truncated unary prefix. For the sake of brevity, Table 2 includes X values that indicate either a one or zero bit value. It should be noted that the X values uniquely map each value sharing a truncated unary prefix according to a fixed length code. The magnitude of the last position component in Table 2 may correspond to an x-coordinate value and/or a y-coordinate value.

TABLE 2

Binarization for a TU of size 32x32, where X means 1 or 0.

| Magnitude of last position component | Truncated unary (context model) | Fixed binary (bypass) | f_value |
|---|---|---|---|
| 0 | 1 | — | 0 |
| 1 | 01 | — | 0 |
| 2 | 001 | — | 0 |
| 3 | 0001 | — | 0 |
| 4-5 | 00001 | X | 0-1 |
| 6-7 | 000001 | X | 0-1 |
| 8-11 | 0000001 | XX | 0-3 |
| 12-15 | 00000001 | XX | 0-3 |
| 16-23 | 000000001 | XXX | 0-7 |
| 24-31 | 000000000 | XXX | 0-7 |

Table 3 and 4 show a comparison of the maximum length of bit strings for the example binarization scheme described with respect to Table 1 and the example binarization scheme describe with respect to Table 2. As shown in Table 3, the unary code prefix may have a maximum length of 16 bins for a 32×32 TU in the example described with respect to Table 1. While the unary code prefix may have a maximum length of 16 bins for a 32×32 TU in the example described with respect to Table 2. Further, as shown in Table 4, the overall length of the based on the truncated unary prefix and the fixed length suffix, the maximum number of the bins for the example described with respect to Table 2 may be 24 in the worst case, i.e., when last position is located at the end of a 32×32 TU, while the worst case for the example described with respect to Table 1 may be 40.

TABLE 3

Maximum length of the truncated unary code.

|  | Table 1 | Table 2 |
|---|---|---|
| TU 4x4 | 3 | 3 |
| TU 8x8 | 4 | 5 |
| TU 16x16 | 8 | 7 |
| TU 32x32 | 16 | 9 |
| Total (Luma) | 31 | 24 |
| Total (Chroma) | 15 | 15 |

TABLE 4

Maximum length of the bins on one last position component.

|  | Table 1 | Table 2 |
|---|---|---|
| TU 4x4 | 3 | 3 |
| TU 8x8 | 6 | 6 |
| TU 16x16 | 11 | 9 |
| TU 32x32 | 20 | 12 |

In another example a truncated unary coding scheme that provides a number of zero bits followed by a one bit or a number of one bits followed by a one bit a truncated unary code prefix coding the position of a last significant coefficient may be defined according to $N=\{0, \ldots, \log_2(T)+1\}$. In each of these truncated unary coding schemes, $\log_2(T)+1$ may define the maximum length of a truncated unary prefix for a TU of size T. For example, for a TU where T equals 32, the maximum length of the truncated unary prefix is equal to six and where T equals 8, the maximum length of the truncated unary prefix is equal to five.

For a truncated unary code, value n, a fixed length code suffix may include the following b bits of fixed length binary code with a value of defined as follows: f_value={0, ..., $2^b-1$}, where b=n-2. Thus, the magnitude of last position, last_pos, can be derived from n and f_value as:

$$\text{last\_pos} = \begin{cases} n, & \text{if } n < 4 \\ 2^{n-2} + \text{f\_value}, & \text{if } n \geq 4 \end{cases} \quad (2)$$

where f_value represents the value of the fixed length code.

Table 5 shows of an example binarization of a position of a last significant coefficient according to the definitions provided according to Equation 2 for a 32×32 TU. The second column of Table 5 provides for corresponding truncated unary prefix values for possible values of the position of a last significant coefficient within a TU of size T of defined by the maximum truncated unary prefix length of $\log_2(T)+1$. The third column of Table 5 provides a corresponding fixed length suffix for each truncated unary prefix. For the sake of brevity, Table 2 includes X values that indicate either a one or zero bit value. It should be noted that the X values uniquely map each value sharing a truncated unary prefix according to a fixed length code. The magnitude of the last position component in Table 5 may correspond to an x-coordinate value and/or a y-coordinate value.

TABLE 5

Example binarization for TU 32x32, where X means 1 or 0.

| Magnitude of last position component | Truncated unary (context model) | Fixed binary (bypass) | f_value |
|---|---|---|---|
| 0 | 1 | — | 0 |
| 1 | 01 | — | 0 |
| 2 | 001 | — | 0 |
| 3 | 0001 | — | 0 |
| 4-7 | 00001 | XX | 0-3 |
| 8-15 | 000001 | XXX | 0-7 |
| 16-31 | 000000 | XXXX | 0-15 |

In another example a truncated unary coding scheme that provides a number of zero bits followed by a one bit or a number of one bits followed by a one bit a truncated unary code prefix coding the position of a last significant coefficient may be defined according to N={0, ..., $\log_2(T)$}. In each of these truncated unary coding schemes, $\log_2(T)$ may define the maximum length of a truncated unary prefix for a TU of size T. For example, for a TU where T equals 32, the maximum length of the truncated unary prefix is equal to five and where T equals 8, the maximum length of the truncated unary prefix is equal to five.

For a truncated unary code, value n, a fixed length code suffix may include the following b bits of fixed length binary code with a value of defined as follows: f_value={0, ..., $2^b-1$}, where b=n-1. Thus, the magnitude of last position, last_pos, can be derived from n and f_value as:

$$\text{last\_pos} = \begin{cases} n, & \text{if } n < 2 \\ 2^{n-1} + \text{f\_value}, & \text{if } n \geq 2 \end{cases} \quad (3)$$

where f_value represents the value of the fixed length code. Table 6 shows of an example binarization of a position of a last significant coefficient according to the definitions provided according to Equation 3 for a 32×32 TU. The second column of Table 6 provides for corresponding truncated unary prefix values for possible values of the position of a last significant coefficient within a TU of size T of defined by the maximum truncated unary prefix length of $\log_2(T)$. The third column of Table 6 provides a corresponding fixed length suffix for each truncated unary prefix. For the sake of brevity, Table 6 includes X values that indicate either a one or zero bit value. It should be noted that the X values uniquely map each value sharing a truncated unary prefix according to a fixed length code. The magnitude of the last position component in Table 6 may correspond to an x-coordinate value and/or a y-coordinate value.

TABLE 6

Example binarization for TU 32x32, where X means 1 or 0.

| Magnitude of last position component | Truncated unary (context model) | Fixed binary (bypass) | f_value |
|---|---|---|---|
| 0 | 1 | — | 0 |
| 1 | 01 | — | 0 |
| 2-3 | 001 | X | 0-1 |
| 4-7 | 0001 | XX | 0-3 |
| 8-15 | 00001 | XXX | 0-7 |
| 16-31 | 00000 | XXXX | 0-15 |

Tables 5 and 6 show some alternative examples of using a truncated unary prefix and a fixed length suffix to code the position of a last significant coefficient. The examples, shown in Tables 5 and 6, allow for shorter bins than the example provided with respect to Table 2. It should be noted, that in the example where the position of the last significant coefficient is determined based on an x-coordinate value and a y-coordinate value, any of the example binarization schemes shown in Tables 1, 2, 5 and 6 may be selected independently for the x-coordinate value and the y-coordinate value. For example, the x-coordinate value may be encoded based on the binarization scheme described with respect to Table 2, while the y-coordinate value may be encoded based on the binarization scheme described with respect to Table 6.

As described above, coding data symbols using CABAC may involve one or more of the following steps binarization and context assignment. In one example, last position value context modeling may be used for arithmetic encoding of the truncated unary strings while context modeling may not be used for arithmetic encoding of the fixed binary strings (i.e. bypassed). In the case where truncated unary strings are encoded using context modelling, a context is assigned to each of bin index of a binary string. Individual bin indices may share a context assignment. The number of context assignment is equal to the number of bin indexes or length of a truncated unary string. Thus, in the cases in the examples illustrated in Tables 1, 2, 5 and 6 associated context tables may be specified accordingly to the binarization scheme. Table 7 illustrates a possible context indexing for each bin of different TU sizes for the example binarizations provided above with respect to Table 2 above. It should be noted that the example context indexing provided in Table 7 provides two fewer contexts than the context indexing provided in Seregin.

TABLE 7

| | Bin index | | | | | | | | |
|---|---|---|---|---|---|---|---|---|---|
| | 0 | 1 | 2 | 3 | 4 | 5 | 6 | 7 | 8 |
| TU 4 × 4 | 0 | 1 | 2 | | | | | | |
| TU 8 × 8 | 3 | 4 | 5 | 5 | 6 | | | | |
| TU 16 × 16 | 7 | 8 | 9 | 9 | 10 | 10 | 11 | | |
| TU 32 × 32 | 12 | 13 | 14 | 14 | 15 | 15 | 16 | 16 | 17 |

Tables 8 to 11 each illustrate some examples context indexing according to the following rules created for context modelling:

1. First K bins are not sharing context, where K>1. K could be different for each TU size.
2. One context can only be assigned to consecutive bins. For example, bin 3-bin5 could use context 5. But bin3 and bin5 use context 5 and bin4 use context 6 is not allowed.
3. The last Nbin, N>=0, of different TU sizes can share the same context.
4. The number of bins that share the same context increases with TU sizes.

Rules 1-4 above may be particularly useful for the binarization provided in Table 2. However, context modelling may be adjusted accordingly based on the binarization scheme that is implemented.

TABLE 8

| | Bin index | | | | | | | | |
|---|---|---|---|---|---|---|---|---|---|
| | 0 | 1 | 2 | 3 | 4 | 5 | 6 | 7 | 8 |
| TU 4 × 4 | 0 | 1 | 2 | | | | | | |
| TU 8 × 8 | 3 | 4 | 5 | 6 | 7 | | | | |
| TU 16 × 16 | 8 | 9 | 10 | 11 | 11 | 12 | 12 | | |
| TU 32 × 32 | 13 | 14 | 14 | 15 | 16 | 16 | 16 | 16 | 17 |

TABLE 9

| | Bin index | | | | | | | | |
|---|---|---|---|---|---|---|---|---|---|
| | 0 | 1 | 2 | 3 | 4 | 5 | 6 | 7 | 8 |
| TU 4 × 4 | 0 | 1 | 2 | | | | | | |
| TU 8 × 8 | 3 | 4 | 5 | 6 | 6 | | | | |
| TU 16 × 16 | 8 | 9 | 10 | 11 | 11 | 12 | 12 | | |
| TU 32 × 32 | 13 | 14 | 14 | 15 | 16 | 16 | 16 | 16 | 17 |

TABLE 10

| | Bin index | | | | | | | | |
|---|---|---|---|---|---|---|---|---|---|
| | 0 | 1 | 2 | 3 | 4 | 5 | 6 | 7 | 8 |
| TU 4 × 4 | 0 | 1 | 2 | | | | | | |
| TU 8 × 8 | 3 | 4 | 5 | 6 | 7 | | | | |
| TU 16 × 16 | 8 | 9 | 10 | 11 | 11 | 12 | 12 | | |
| TU 32 × 32 | 13 | 14 | 14 | 15 | 16 | 16 | 16 | 12 | 12 |

TABLE 11

| | Bin index | | | | | | | | |
|---|---|---|---|---|---|---|---|---|---|
| | 0 | 1 | 2 | 3 | 4 | 5 | 6 | 7 | 8 |
| TU 4 × 4 | 0 | 1 | 2 | | | | | | |
| TU 8 × 8 | 3 | 4 | 5 | 6 | 7 | | | | |

TABLE 11-continued

| | Bin index | | | | | | | | |
|---|---|---|---|---|---|---|---|---|---|
| | 0 | 1 | 2 | 3 | 4 | 5 | 6 | 7 | 8 |
| TU 16 × 16 | 8 | 9 | 10 | 10 | 11 | 11 | 12 | | |
| TU 32 × 32 | 13 | 14 | 14 | 15 | 15 | 15 | 16 | 16 | 16 |

Figure 5:
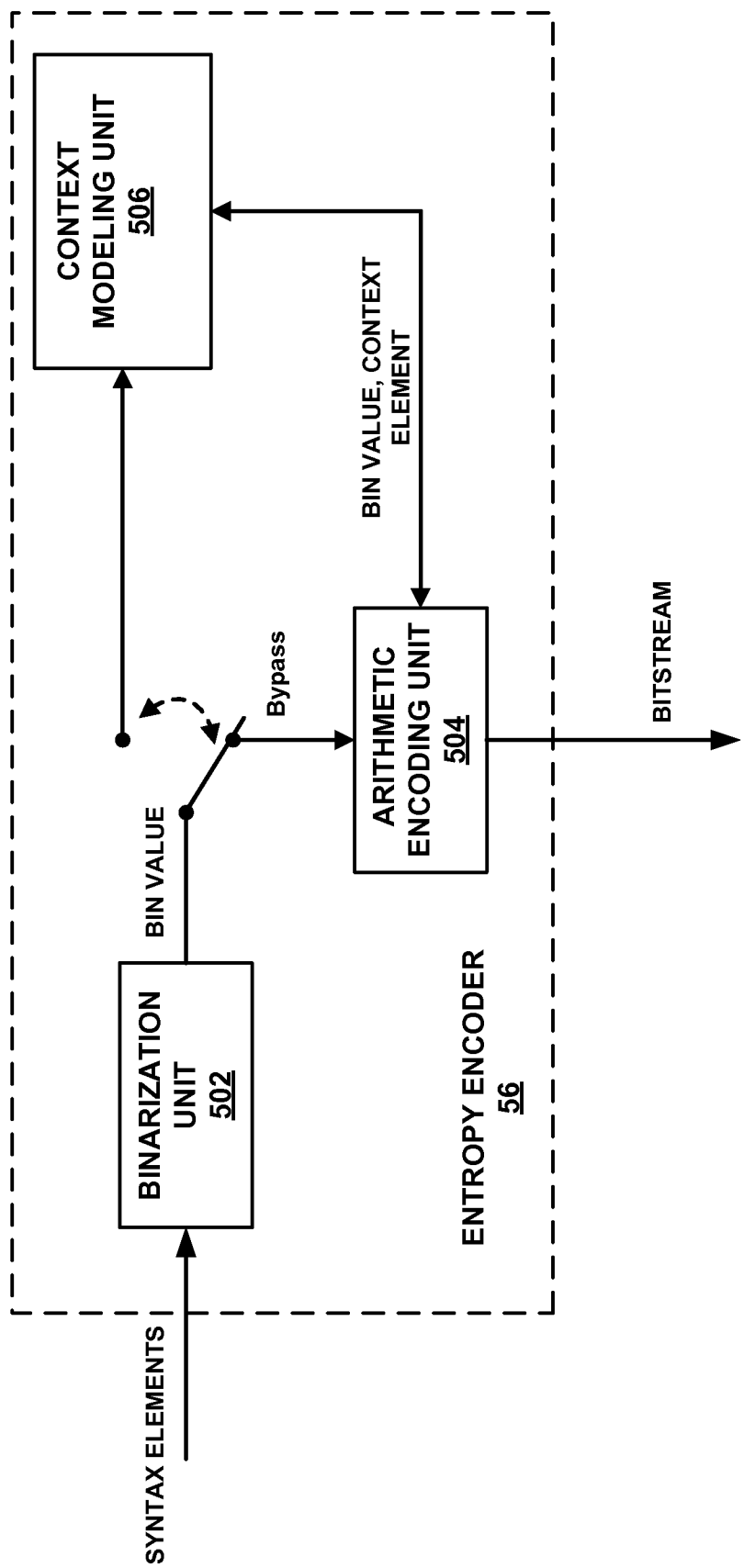
FIG. 5 is a block diagram illustrating an example entropy encoder that may implement the techniques described in this disclosure.

FIG. 5 is a block diagram illustrates an example entropy encoder 56 that may implement the techniques described in this disclosure. Entropy encoder 56 receives syntax elements, such as one or more syntax elements representing the position of the last significant transform coefficient within a transform block coefficients and encodes the syntax element into a bitstream. The syntax elements may include a syntax element specifying an x-coordinate of the position of a last significant coefficient within a transform coefficient block and a syntax element specifying a y-coordinate of the position of a last significant coefficient within a transform coefficient block. In one example, the entropy encoder 56 illustrated in FIG. 5 may be a CABAC encoder. The example entropy encoder 56 in FIG. 5 may include a binarization unit 502, an arithmetic encoding unit 504, and a context assignment unit 506.

Binarization unit 502 receives a syntax element and produces a bin string. In one example, binarization unit 502 receives a value representing the last position of a significant coefficient within a block of transform coefficients and produces bit string or bin value according to the examples described above. Arithmetic encoding unit 504 receives a bit string from binarization unit 502 and performs arithmetic encoding on the codeword. As shown in FIG. 5, arithmetic encoder 504 may receive bin values from a bypass path or from context modeling unit 506. In the case where arithmetic encoding unit 504 receives bin values from context modeling unit 506, arithmetic encoding unit 504 may perform arithmetic encoding based on context assignments provided by context assignment unit 506. In one example, arithmetic encoding unit 504 may use context assignments to encode a prefix portion of a bit string and may encode a suffix portion of a bit string without using context assignments.

In one example, context assignment unit 506 may assign contexts based on the example context indexing provided in Tables 7-11 above. In this manner video encoder 20 represents a video encoder configured to obtain a value indicating a position of a last significant coefficient within a video block of size T, determine a first binary string for the value indicating the position of the last significant coefficient based on a truncated unary coding scheme defined by a maximum bit length defined by $2 \log_2(T)-1$, $\log_2(T)+1$, or $\log_2(T)$, determine a second binary string for the value indicating the position of the last significant coefficient based on a fixed length coding scheme and encode the first and second binary strings to a bitstream.

Figure 6:
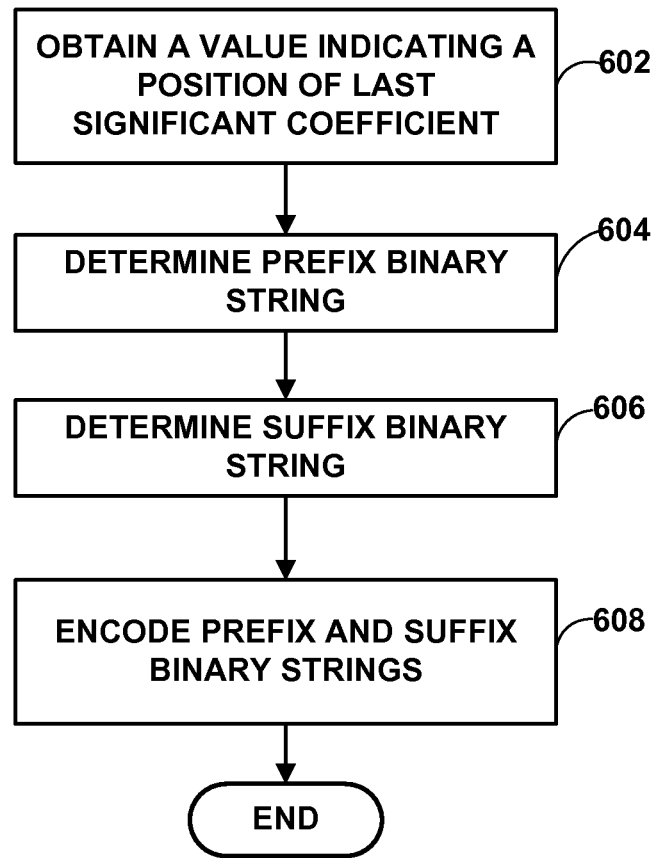
FIG. 6 is a flowchart illustrating an example method for determining a binary string for a value indicating the position of a last significant coefficient in accordance with the techniques of this disclosure.

FIG. 6 is a flowchart illustrating an example method for determining a binary string for a value indicating the position of a last significant coefficient in accordance with the techniques of this disclosure. The method described in FIG. 6 may be performed by any of the example video encoders or entropy encoders described herein. At step 602, a value indicating the position of a last significant transform coefficient within a video block is obtained. At step 604, a prefix binary string for the value indicating the position of the last significant coefficient is determined. The prefix binary string may be determined using any of the techniques described herein. In one example, the prefix binary may be based on a truncated unary coding scheme defined by a maximum bit length defined by $2\log_2(T)-1$, where T defines the size of a video block. In another example, the prefix binary may be based on a truncated unary coding scheme defined by a maximum bit length defined by $\log_2(T)+1$, where T defines the size of a video block. In yet another example, the prefix binary may be based on a truncated unary coding scheme defined by a maximum bit length defined by $\log_2(T)$, where T defines the size of a video block. The prefix binary string may be determined by an encoder performing a set of calculations, by an encoder using lookup tables, or a combination thereof. For example, an encoder may use any of Tables 2, 5 and 6 to determine the prefix binary string.

At step 606, a suffix binary string for the value indicating the position of the last significant coefficient is determined. The suffix binary string may be determined using any of the techniques described herein. In one example, the suffix binary string may be based on a fixed length coding scheme defined by a maximum bit length defined by $\log_2(T)-2$, where T defines the size of a video block. In another example, the suffix binary string may be based on a fixed length coding scheme defined by a maximum bit length defined by $\log_2(T)-1$, where T defines the size of a video block. The suffix binary string may be determined by an encoder performing a set of calculations, by an encoder using lookup tables, or a combination thereof. For example, an encoder may use any of Tables 2, 5 and 6 to determine the suffix binary string. At step 608, the prefix and suffix binary strings are encoded into a bitstream. In one example, the prefix and suffix binary strings may be encoded using arithmetic encoding. It should be noted that the prefix and suffix portion of a bitstream may be interchanged. Arithmetic encoding may be part of a CABAC encoding process or part of another entropy encoding process.

Tables 12-14 provide a summary of simulation results of the coding performance of the example binarization scheme described with respect to Table 1 and the example binarization scheme described with respect to Table 2. The simulation results in Tables 12-14 were obtained using the high efficiency common test conditions as defined by: F. Bossen, "Common test conditions and software reference configurations", JCTVC-F900. The negative values in Tables 12-14 indicate a lower bitrate of the binarization scheme described with respect to Table 2 compared to the binarization scheme described with respect to Table 1. Enc Time and Dec Time in Tables 12-14 describe the amount of time required to encode and decode, respectively, the bitstream resulting from the use the binarization scheme described with respect to Table 2 compared with the amount of time required to encode (or decode) the bitstream resulting from the use of the binarization scheme described with respect to Table 1. As can be seen from the experimental results shown in Tables 12-14, the binarization scheme described with respect to Table 2 provides respective BD-rate performance gains of −0.04%, −0.01% and −0.03% in high efficiency intra-only, random access and low-delay test conditions.

Classes A-E in the tables below represent various sequences of video data. The columns Y, U, and V correspond to data for luma, U-chroma, and V-chroma, respectively. Table 12 summarizes this data for a configuration in which all data is coded in intra-mode. Table 13 summarizes this data for a configuration in which all data is coded in "random access" where both intra- and inter-modes are available. Table 14 summarizes this data for a configuration in which pictures are coded in a low delay B mode.

TABLE 12

All Intra HE

|  | Y | U | V |
|---|---|---|---|
| Class A | −0.03% | 0.01% | 0.02% |
| Class B | −0.05% | −0.03% | −0.02% |
| Class C | −0.02% | −0.01% | −0.02% |
| Class D | −0.03% | −0.01% | −0.06% |
| Class E | −0.08% | −0.04% | −0.01% |
| All | −0.04% | −0.02% | −0.02% |
| Enc Time [%] |  | 99% |  |
| Dec Time [%] |  | 100% |  |

TABLE 13

Random Access HE

|  | Y | U | V |
|---|---|---|---|
| Class A | 0.03% | 0.05% | −0.07% |
| Class B | −0.05% | 0.04% | −0.21% |
| Class C | −0.01% | −0.08% | −0.03% |
| Class D | 0.00% | 0.01% | −0.12% |
| Class E |  |  |  |
| All | −0.01% | 0.01% | −0.11% |
| Enc Time [%] |  | 100% |  |
| Dec Time [%] |  | 100% |  |

TABLE 14

Low Delay B HE

|  | Y | U | V |
|---|---|---|---|
| Class A |  |  |  |
| Class B | −0.04% | −0.16% | −0.37% |
| Class C | 0.02% | −0.10% | −0.24% |
| Class D | 0.06% | 0.57% | −0.08% |
| Class E | −0.21% | −0.65% | 0.66% |
| Overall | −0.03% | −0.05% | −0.07% |
| Enc Time [%] |  | 99% |  |
| Dec Time [%] |  | 100% |  |

Figure 7:
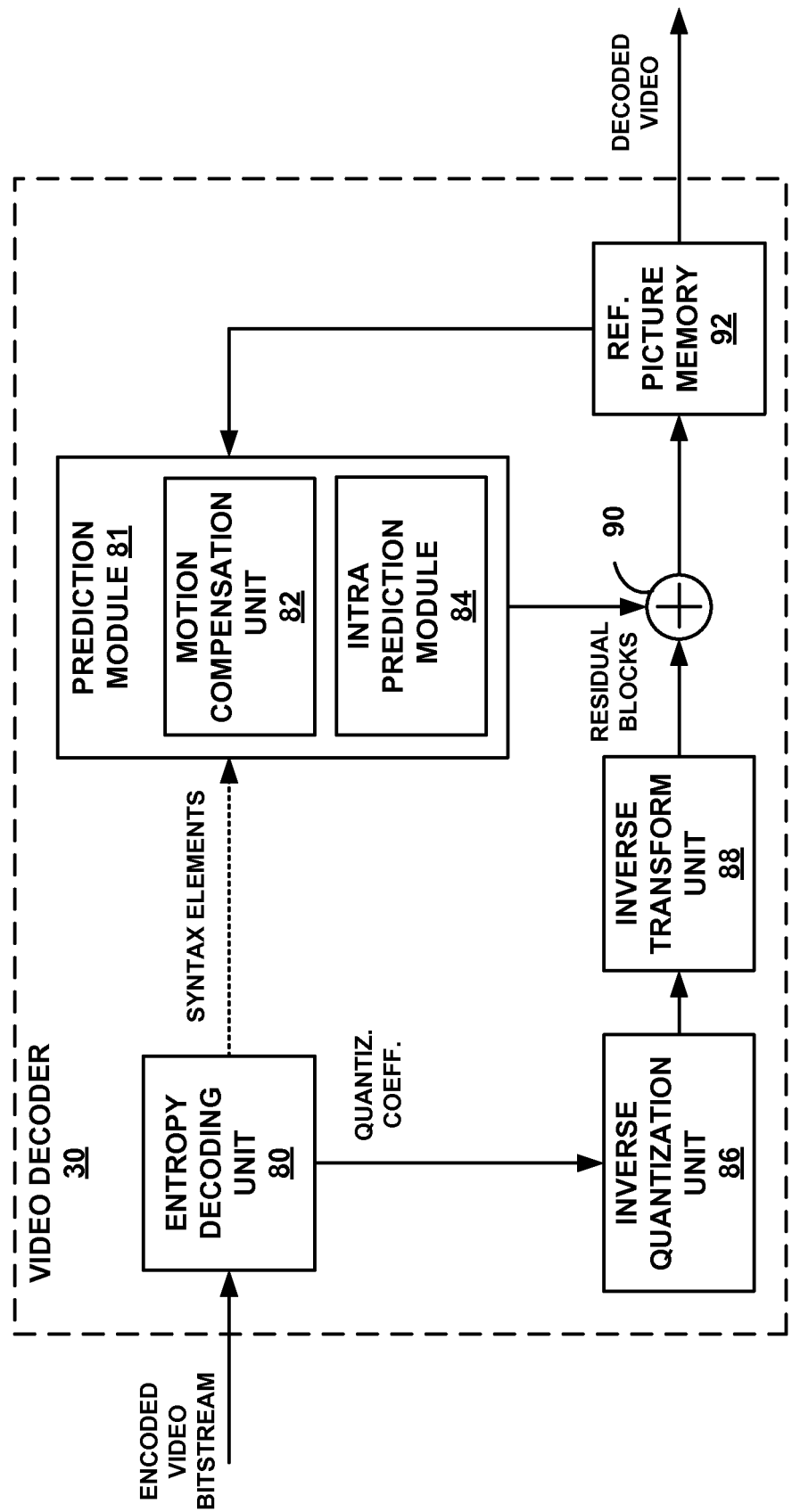
FIG. 7 is a block diagram illustrating an example video decoder that may implement the techniques described in this disclosure.

FIG. 7 is a block diagram illustrating an example video decoder 30 that may implement the techniques described in this disclosure. In the example of FIG. 7, video decoder 30 includes an entropy decoding unit 80, prediction module 81, inverse quantization unit 86, inverse transformation module 88, summer 90, and reference picture memory 92. Prediction module 81 includes motion compensation unit 82 and intra prediction module 84. Video decoder 30 may, in some examples, perform a decoding pass generally reciprocal to the encoding pass described with respect to video encoder 20 from FIG. 4.

During the decoding process, video decoder 30 receives an encoded video bitstream that represents video blocks of an encoded video slice and associated syntax elements from video encoder 20. Entropy decoding unit 80 of video decoder 30 entropy decodes the bitstream to generate quantized coefficients, motion vectors, and other syntax elements. Entropy decoding unit 80 may determine a value indicating the position of a last significant coefficient within a transform coefficient based on the techniques described herein. Entropy decoding unit 80 forwards the motion vectors and other syntax elements to prediction module 81. Video decoder 30 may receive the syntax elements at the video slice level and/or the video block level.

When the video slice is coded as an intra-coded (I) slice, intra prediction module 84 of prediction module 81 may generate prediction data for a video block of the current video slice based on a signaled intra prediction mode and data from previously decoded blocks of the current frame or picture. When the video frame is coded as an inter-coded (i.e., B, P or GPB) slice, motion compensation unit 82 of prediction module 81 produces predictive blocks for a video block of the current video slice based on the motion vectors and other syntax elements received from entropy decoding unit 80. The predictive blocks may be produced from one of the reference pictures within one of the reference picture lists. Video decoder 30 may construct the reference frame lists, List 0 and List 1, using default construction techniques based on reference pictures stored in reference picture memory 92.

Motion compensation unit 82 determines prediction information for a video block of the current video slice by parsing the motion vectors and other syntax elements, and uses the prediction information to produce the predictive blocks for the current video block being decoded. For example, motion compensation unit 82 uses some of the received syntax elements to determine a prediction mode (e.g., intra- or inter-prediction) used to code the video blocks of the video slice, an inter-prediction slice type (e.g., B slice, P slice, or GPB slice), construction information for one or more of the reference picture lists for the slice, motion vectors for each inter-encoded video block of the slice, inter-prediction status for each inter-coded video block of the slice, and other information to decode the video blocks in the current video slice.

Motion compensation unit 82 may also perform interpolation based on interpolation filters. Motion compensation unit 82 may use interpolation filters as used by video encoder 20 during encoding of the video blocks to calculate interpolated values for sub-integer pixels of reference blocks. In this case, motion compensation unit 82 may determine the interpolation filters used by video encoder 20 from the received syntax elements and use the interpolation filters to produce predictive blocks.

Inverse quantization unit 86 inverse quantizes, i.e., de-quantizes, the quantized transform coefficients provided in the bitstream and decoded by entropy decoding unit 80. The inverse quantization process may include use of a quantization parameter calculated by video encoder 20 for each video block in the video slice to determine a degree of quantization and, likewise, a degree of inverse quantization that should be applied. Inverse transform module 88 applies an inverse transform, e.g., an inverse DCT, an inverse integer transform, or a conceptually similar inverse transform process, to the transform coefficients in order to produce residual blocks in the pixel domain.

After prediction module 81 generates the predictive block for the current video block based on either inter- or intra-prediction, video decoder 30 forms a decoded video block by summing the residual blocks from inverse transform module 88 with the corresponding predictive blocks generated by prediction module 81. Summer 90 represents the component or components that perform this summation operation. If desired, a deblocking filter may also be applied to filter the decoded blocks in order to remove blockiness artifacts. Other loop filters (either in the coding loop or after the coding loop) may also be used to smooth pixel transitions, or otherwise improve the video quality. The decoded video blocks in a given frame or picture are then stored in reference picture memory 92, which stores reference pictures used for subsequent motion compensation. Reference picture memory 92 also stores decoded video for later presentation on a display device, such as display device 32 of FIG. 1. In this manner video decoder 30 represents a video decoder configured to obtain a first binary string and a second binary string from an encoded bitstream, determine a value indicating the position of a last significant coefficient within a video block of size T based in part on the first binary string, wherein the first binary string is defined by a truncated unary coding scheme with a maximum bit length defined by $2 \log_2(T)-1$ and determine the value indicating the position of the last significant coefficient based in part on the second binary string, wherein the second binary string is defined by a fixed length coding scheme.

Figure 8:
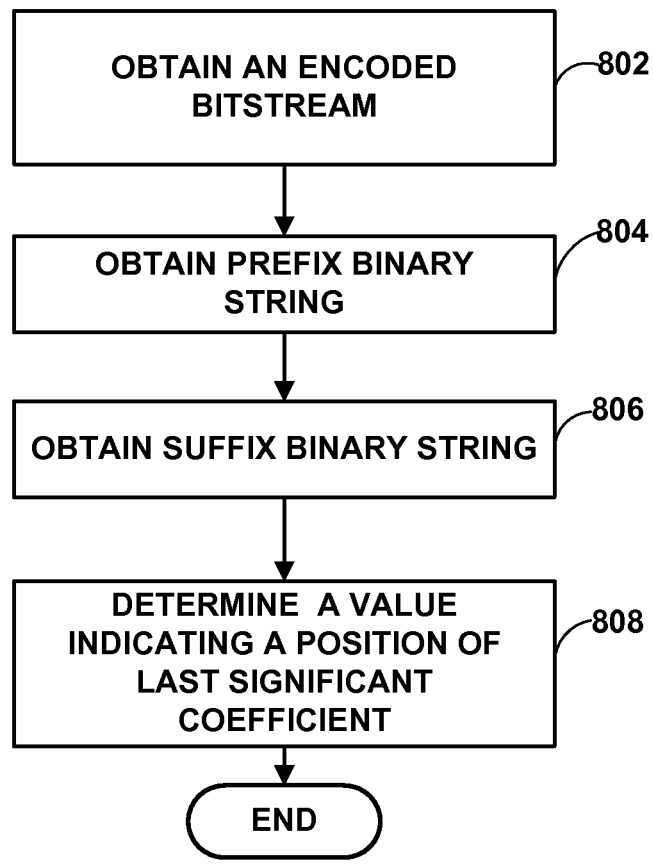
FIG. 8 is a flowchart illustrating an example method for determining a value indicating the position of a last significant coefficient from a binary string in accordance with the techniques of this disclosure.

FIG. 8 is a flowchart illustrating an example method for determining a value indicating the position of a last significant coefficient within a transform coefficient from a binary string in accordance with the techniques of this disclosure. The method described in FIG. 8 may be performed by any of the example video decoders or entropy decoding units described herein. At step 802, an encoded bitstream is obtained. An encoded bitstream may be retrieved from a memory or through a transmission. The encoded bitstream may be encoded according to a CABAC encoding process or another entropy coding process. At step 804, a prefix binary string is obtained. At step 806, a suffix binary string is obtained. The prefix binary string and suffix binary string may be obtained by decoding the encoded bitstream. Decoding may include arithmetic decoding. Arithmetic decoding may be part of a CABAC decoding processor or another entropy decoding process. At step 808, a value indicating a position of a last significant coefficient is determined within a video block of size T. In one example, the position of a last significant coefficient is determined based in part on the prefix binary string, wherein the prefix binary string is defined by a truncated unary coding scheme with a maximum bit length defined by $2 \log_2(T)-1$ where T defines the size of a video block. In one example, the position of a last significant coefficient is determined based in part on the prefix binary string, wherein the prefix binary string is defined by a truncated unary coding scheme with a maximum bit length defined by $\log_2(T)+1$ where T defines the size of a video block. In one example, the position of a last significant coefficient is determined based in part on the prefix binary string, wherein the prefix binary string is defined by a truncated unary coding scheme with a maximum bit length defined by $\log_2(T)$, where T defines the size of a video block. In one example, the position of the last significant coefficient based in part on the suffix binary string, wherein the suffix binary string is defined by a fixed length coding scheme with a maximum bit length defined by $\log_2(T)-2$, where T defines the size of a video block. In another example, the second binary string may be based on a fixed length coding scheme defined by a maximum bit length defined by $\log_2(T)-1$, where T defines the size of a video block. It should be noted that the prefix and suffix portion of a bitstream may be interchanged In one or more examples, the functions described may be implemented in hardware, software, firmware, or any combination thereof. If implemented in software, the functions may be stored on or transmitted over, as one or more instructions or code, a computer-readable medium and executed by a hardware-based processing unit. Computer-readable media may include computer-readable storage media, which corresponds to a tangible medium such as data storage media, or communication media including any medium that facilitates transfer of a computer program from one place to another, e.g., according to a communication protocol. In this manner, computer-readable media generally may correspond to (1) tangible computer-readable storage media which is non-transitory or (2) a communication medium such as a signal or carrier wave. Data storage media may be any available media that can be accessed by one or more computers or one or more processors to retrieve instructions, code and/or data structures for implementation of the techniques described in this disclosure. A computer program product may include a computer-readable medium.

In still other examples, this disclosure contemplates a computer readable medium comprising a data structure stored thereon, wherein the data structure includes an encoded bitstream consistent with this disclosure. In particular, the encoded bitstream may include an entropy coded bitstream including a first binary string and a second binary string, wherein the first binary string is indicative of a value indicating a position of the last significant coefficient and is based on a truncated unary coding scheme defined by a maximum bit length defined by $2\log_2(T)-1$, and the second binary string is indicative of a value indicating the position of the last significant coefficient and is based on a fixed length coding scheme.

By way of example, and not limitation, such computer-readable storage media can comprise RAM, ROM, EEPROM, CD-ROM or other optical disk storage, magnetic disk storage, or other magnetic storage devices, flash memory, or any other medium that can be used to store desired program code in the form of instructions or data structures and that can be accessed by a computer. Also, any connection is properly termed a computer-readable medium. For example, if instructions are transmitted from a website, server, or other remote source using a coaxial cable, fiber optic cable, twisted pair, digital subscriber line (DSL), or wireless technologies such as infrared, radio, and microwave, then the coaxial cable, fiber optic cable, twisted pair, DSL, or wireless technologies such as infrared, radio, and microwave are included in the definition of medium. It should be understood, however, that computer-readable storage media and data storage media do not include connections, carrier waves, signals, or other transient media, but are instead directed to non-transient, tangible storage media. Disk and disc, as used herein, includes compact disc (CD), laser disc, optical disc, digital versatile disc (DVD), floppy disk and Blu-ray disc, where disks usually reproduce data magnetically, while discs reproduce data optically with lasers. Combinations of the above should also be included within the scope of computer-readable media.

Instructions may be executed by one or more processors, such as one or more digital signal processors (DSPs), general purpose microprocessors, application specific integrated circuits (ASICs), field programmable logic arrays (FPGAs), or other equivalent integrated or discrete logic circuitry. Accordingly, the term "processor," as used herein may refer to any of the foregoing structure or any other structure suitable for implementation of the techniques described herein. In addition, in some aspects, the functionality described herein may be provided within dedicated hardware and/or software modules configured for encoding and decoding, or incorporated in a combined codec. Also, the techniques could be fully implemented in one or more circuits or logic elements.

The techniques of this disclosure may be implemented in a wide variety of devices or apparatuses, including a wireless handset, an integrated circuit (IC) or a set of ICs (e.g., a chip set). Various components, modules, or units are described in this disclosure to emphasize functional aspects of devices configured to perform the disclosed techniques, but do not necessarily require realization by different hardware units. Rather, as described above, various units may be combined in a codec hardware unit or provided by a collection of interoperative hardware units, including one or more processors as described above, in conjunction with suitable software and/or firmware.

Various examples have been described. These and other examples are within the scope of the following claims.

What is claimed is:

1. A method for encoding video data comprising:
   obtaining a value indicating a position of a last significant coefficient within a video block of size T;
   determining a first binary string for the value indicating the position of the last significant coefficient based on a truncated unary coding scheme defined by a maximum bit length defined by $2\log_2(T)-1$;
   determining a second binary string for the value indicating the position of the last significant coefficient based on a fixed length coding scheme including determining a maximum length of the second binary string based on a value of the determined first binary string; and
   encoding the first and second binary strings to a bitstream.

2. The method of claim 1, wherein the fixed length coding scheme is defined by a maximum bit length defined by $\log_2(T)-2$.

3. The method of claim 2, wherein T is equal to 32, wherein the value indicating the position of a last significant coefficient equals 8, and wherein the first binary string has a bit length of 7.

4. The method of claim 1, wherein encoding the first and second binary strings comprises encoding the first binary string followed by encoding the second binary string.

5. The method of claim 1, wherein encoding the first and second binary strings comprises encoding the first and second binary strings using a context adaptive arithmetic coding (CABAC) process, the CABAC process comprising encoding the first binary string based on a context model and bypass encoding the second binary string.

6. The method of claim 5, wherein bypass encoding the second binary string comprises encoding bines of the second binary string using an equal probability state.

7. The method of claim 1, wherein the value indicating the position of the last significant coefficient comprises one of a value indicating an x-position of the last significant coefficient or a value indicating a y-position of the last significant coefficient.

8. A device for encoding video data, the device comprising:
   a memory configured to store a last significant coefficient; and
   a video encoder configured to:
      obtain a value indicating a position of the last significant coefficient within a video block of size T;
      determine a first binary string for the value indicating the position of the last significant coefficient based on a truncated unary coding scheme defined by a maximum bit length defined by $2\log_2(T)-1$;
      determine a second binary string for the value indicating the position of the last significant coefficient based on a fixed length coding scheme including determining a maximum length of the second binary string based on a value of the determined first binary string; and
      encode the first and second binary strings to a bitstream.

9. The device of claim 8, wherein the fixed length coding scheme is defined by a maximum bit length defined by $\log_2(T)-2$.

10. The device of claim 9, wherein T is equal to 32, wherein the value indicating the position of a last significant coefficient equals 8, and wherein the first binary string has a bit length of 7.

11. The device of claim 8, wherein to encode the first and second binary strings, the video encoder is configured to encode the first binary string followed by encoding the second binary string.

12. The device of claim 8, wherein to encode the first and second binary strings, the video encoder is configured to encode the first and second binary strings using a context-adaptive arithmetic coding (CABAC) process, the CABAC process comprising encoding the first binary string based on a context model and bypass encoding the second binary string.

13. The device of claim 12, wherein to bypass encode the second binary string, the video encoder is configured to encode bins of the second binary string using an equal probability state.

14. The device of claim 8, wherein the value indicating the position of the last significant coefficient comprises one of a value indicating an x-position of the last significant coefficient or a value indicating a y-position of the last significant coefficient.

15. A device for encoding video data, the device comprising:
- means for obtaining a value indicating a position of a last significant coefficient within a video block of size T;
- means for determining a first binary string for the value indicating the position of the last significant coefficient based on a truncated unary coding scheme defined by a maximum bit length defined by $2\log_2(T)-1$;
- means for determining a second binary string for the value indicating the position of the last significant coefficient based on a fixed length coding scheme including means for determining a maximum length of the second binary string based on a value of the determined first binary string; and
- means for encoding the first and second binary strings to a bitstream.

16. The device of claim 15, wherein the fixed length coding scheme is defined by a maximum bit length defined by $\log_2(T)-2$.

17. The device of claim 16, wherein T is equal to 32, wherein the value indicating the position of a last significant coefficient equals 8, and wherein the first binary string has a bit length of 7.

18. The device of claim 15, wherein the means for encoding comprises means for encoding the first binary string followed by encoding the second binary string.

19. The device of claim 15, wherein the means for encoding the first and second binary strings comprises means for encoding the first and second binary strings using a context-adaptive arithmetic coding (CABAC) process, the CABAC process comprising encoding the first binary string based on a context model and bypass encoding the second binary string.

20. The device of claim 19, wherein the means for encoding comprises means for bypass encoding bins of the second binary string using an equal probability state.

21. The device of claim 15, wherein the value indicating the position of the last significant coefficient comprises one of a value indicating an x-position of the last significant coefficient or a value indicating a y-position of the last significant coefficient.

22. A non-transitory computer-readable storage medium comprising instructions stored thereon that, when executed, cause one or more processors to:
- obtain a value indicating a position of a last significant coefficient within a video block of size T;
- determine a first binary string for the value indicating the position of the last significant coefficient based on a truncated unary coding scheme defined by a maximum bit length defined by $2\log_2(T)-1$;
- determine a second binary string for the value indicating the position of the last significant coefficient based on a fixed length coding scheme including determining a maximum length of the second binary string based on a value of the determined first binary string; and
- encode the first and second binary strings to a bitstream.

23. The non-transitory computer-readable storage medium of claim 22, wherein the fixed length coding scheme is defined by a maximum bit length defined by $\log_2(T)-2$.

24. The non-transitory computer-readable storage medium of claim 23, wherein T is equal to 32, wherein the value indicating the position of a last significant coefficient equals 8, and wherein the first binary string has a bit length of 7.

25. The non-transitory computer-readable medium of claim 22, wherein to encode the first and second binary strings, the instructions cause the one or more processors to encode the first binary string followed by encoding the second binary string.

26. The non-transitory computer-readable medium of claim 22, wherein to encode the first and second binary strings, the instructions cause the one or more processors to encode the first and second binary strings to a bitstream using a context-adaptive arithmetic coding (CABAC) process, the CABAC process comprising encoding the first binary string based on a context model and bypass encoding the second binary string.

27. The non-transitory computer-readable storage medium of claim 26, wherein to bypass encode the second binary string, the instructions cause the one or more processors to encode bins of the second binary string using an equal probability state.

28. The non-transitory computer-readable storage medium of claim 22, wherein the value indicating the position of the last significant coefficient comprises one of a value indicating an x-position of the last significant coefficient or a value indicating a y-position of the last significant coefficient.

29. A method for decoding video data comprising:
- obtaining a first binary string and a second binary string from an encoded bitstream;
- determining a value indicating the position of a last significant coefficient within a video block of size T based in part on the first binary string, wherein the first binary string is defined by a truncated unary coding scheme with a maximum bit length defined by $2\log_2(T)-1$; and
- determining the value indicating the position of the last significant coefficient based in part on the second binary string, wherein the second binary string is defined by a fixed length coding scheme that includes determining a maximum length of the second binary string based on a value of the determined first binary string.

30. The method of claim 29, wherein the fixed length coding scheme is defined by a maximum bit length defined by $\log_2(T)-2$.

31. The method of claim 30, wherein T is equal to 32, wherein the value indicating the position of a last significant coefficient equals 8, and wherein the first binary string has a bit length of 7.

32. The method of claim 29, wherein obtaining the first binary string and the second binary string comprises decoding the first binary string followed by decoding the second binary string.

33. The method of claim 29, wherein obtaining the first binary string and the second binary string comprises decoding the first binary string and the second binary string using a context-adaptive arithmetic coding (CABAC) process, the CABAC process comprising decoding the first binary string based on a context model and bypass decoding the second binary string.

34. The method of claim 33, wherein bypass decoding the second binary string comprises decoding bins of the second binary string using an equal probability state.

35. The method of claim 29, wherein the value indicating the position of the last significant coefficient comprises one of a value indicating an x-position of the last significant coefficient or a value indicating a y-position of the last significant coefficient.

36. A device for decoding video data, the device comprising:
   a memory configured to store a first binary string and a second binary string of an encoded bitstream; and
   a video decoder configured to:
      obtain a first binary string and the second binary string from the encoded bitstream;
      determine a value indicating the position of a last significant coefficient within a video block of size T based in part on the first binary string, wherein the first binary string is defined by a truncated unary coding scheme with a maximum bit length defined by $2\log_2(T)-1$; and
      determine the value indicating the position of the last significant coefficient based in part on the second binary string, wherein the second binary string is defined by a fixed length coding scheme that includes determining a maximum length of the second binary string based on a value of the determined first binary string.

37. The device of claim 36, wherein the fixed length coding scheme is defined by a maximum bit length defined by $\log_2(T)-2$.

38. The device of claim 37, wherein T is equal to 32, wherein the value indicating the position of a last significant coefficient equals 8, and wherein the first binary string has a bit length of 7.

39. The device of claim 36, wherein to obtain the first binary string and the second binary string, the video decoder is configured to decode the first binary string followed by decoding the second binary string.

40. The device of claim 36, wherein to obtain the first binary string and the second binary string, the video decoder is configured to decode the first binary string and the second binary string using a context-adaptive arithmetic coding (CABAC) process, the CABAC process comprising decoding the first binary string based on a context model and bypass decoding the second binary string.

41. The device of claim 40, wherein to bypass decode the second binary string, the video decoder is configured to decode bins of the second binary string using an equal probability state.

42. The device of claim 36, wherein the value indicating the position of the last significant coefficient comprises one of a value indicating an x-position of the last significant coefficient or a value indicating a y-position of the last significant coefficient.

43. A device for decoding video data, the device comprising:
   means for obtaining a first binary string and a second binary string from an encoded bitstream;
   means for determining a value indicating the position of a last significant coefficient within a video block of size T based in part on the first binary string, wherein the first binary string is defined by a truncated unary coding scheme with a maximum bit length defined by $2\log_2(T)-1$; and
   means for determining the value indicating the position of the last significant coefficient based in part on the second binary string, wherein the second binary string is defined by a fixed length coding scheme that includes determining a maximum length of the second binary string based on a value of the determined first binary string.

44. The device of claim 43, wherein the fixed length coding scheme is defined by a maximum bit length defined by $\log_2(T)-2$.

45. The device of claim 44, wherein T is equal to 32, wherein the value indicating the position of a last significant coefficient equals 8, and wherein the first binary string has a bit length of 7.

46. The device of claim 43, wherein the means for obtaining the first binary string and the second binary string comprises means for decoding the first binary string followed by decoding the second binary string.

47. The device of claim 43, wherein the means for obtaining the first binary string and the second binary string comprises means for decoding the first binary string and the second binary string using a context-adaptive arithmetic coding (CABAC) process, the CABAC process comprising decoding the first binary string based on a context model and bypass decoding the second binary string.

48. The device of claim 47, wherein the means for decoding comprises means for bypass decoding bins of the second binary string using an equal probability state.

49. The device of claim 43, wherein the value indicating the position of the last significant coefficient comprises one of a value indicating an x-position of the last significant coefficient or a value indicating a y-position of the last significant coefficient.

50. A non-transitory computer-readable storage medium comprising instructions stored thereon that, when executed, cause one or more processors to:
   obtain a first binary string and a second binary string from an encoded bitstream;
   determine a value indicating the position of a last significant coefficient within a video block of size T based in part on the first binary string, wherein the first binary string is defined by a truncated unary coding scheme with a maximum bit length defined by $2\log_2(T)-1$; and
   determine the value indicating the position of the last significant coefficient based in part on the second binary string, wherein the second binary string is defined by a fixed length coding scheme that includes determining a maximum length of the second binary string based on a value of the determined first binary string.

51. The non-transitory computer-readable storage medium of claim 50, wherein the fixed length coding scheme is defined by a maximum bit length defined by $\log_2(T)-2$.

52. The non-transitory computer-readable storage medium of claim 51, wherein T is equal to 32, wherein the value indicating the position of a last significant coefficient equals 8, and wherein the first binary string has a bit length of 7.

53. The non-transitory computer-readable medium of claim 50, wherein to obtain the first binary string and the second binary string, the instructions cause the one or more processors to decode the first binary string followed by decoding the second binary string.

54. The non-transitory computer-readable medium of claim 50, wherein to obtain the first binary string and the second binary string, the instructions cause the one or more processors to decode the first binary string and the second binary string using a context-adaptive arithmetic coding (CABAC) process, the CABAC process comprising decoding the first binary string based on a context model and bypass decoding the second binary string.

55. The non-transitory computer-readable storage medium of claim 54, wherein to bypass decode the second binary string, the instructions cause the one or more processors to decode bins of the second binary string using an equal probability state.

56. The non-transitory computer-readable storage medium of claim 50, wherein the value indicating the position of the last significant coefficient comprises one of a value indicating an x-position of the last significant coefficient or a value indicating a y-position of the last significant coefficient.

* * * * *